US012562750B2

(12) United States Patent
Kim et al.

(10) Patent No.: US 12,562,750 B2
(45) Date of Patent: Feb. 24, 2026

(54) ANALOG-TO-DIGITAL CIRCUIT AND OPERATION METHOD THEREOF

(71) Applicant: SAMSUNG ELECTRONICS CO., LTD., Suwon-si (KR)

(72) Inventors: Yunhong Kim, Suwon-si (KR); Heesung Chae, Suwon-si (KR); Keunyeol Park, Suwon-si (KR); Ingyeong Shin, Suwon-si (KR); Moo Young Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 18/596,913

(22) Filed: Mar. 6, 2024

(65) Prior Publication Data

US 2025/0038760 A1     Jan. 30, 2025

(30) Foreign Application Priority Data

Jul. 25, 2023     (KR) ........................ 10-2023-0096913

(51) Int. Cl.
| | |
|---|---|
| *H03M 1/34* | (2006.01) |
| *H03M 1/12* | (2006.01) |
| *H03M 1/56* | (2006.01) |
| *H04N 25/76* | (2023.01) |
| *H04N 25/77* | (2023.01) |
| *H04N 25/772* | (2023.01) |
| *H04N 25/78* | (2023.01) |

(52) U.S. Cl.
CPC ............. *H03M 1/34* (2013.01); *H03M 1/123* (2013.01); *H03M 1/56* (2013.01); *H04N 25/77*

(2023.01); *H04N 25/772* (2023.01); *H04N 25/7795* (2023.01); *H04N 25/78* (2023.01)

(58) Field of Classification Search
CPC .......... H03M 1/34; H03M 1/123; H03M 1/56; H04N 25/77; H04N 25/78; H04N 25/772; H04N 25/7795
USPC ................................ 341/126, 155, 158, 169
See application file for complete search history.

(56) References Cited

U.S. PATENT DOCUMENTS

| | | | |
|---|---|---|---|
| 7,479,916 B1 | 1/2009 | Reshef et al. | |
| 8,736,732 B2 | 5/2014 | Utsunomiya et al. | |
| 9,019,138 B2 | 4/2015 | Iwaki | |
| 9,681,082 B2 * | 6/2017 | Lee .......................... | H04N 25/78 |
| 10,097,196 B2 | 10/2018 | Sato | |
| 10,567,685 B2 | 2/2020 | Sato et al. | |
| 10,841,524 B2 | 11/2020 | Hisamatsu et al. | |
| 11,115,611 B2 * | 9/2021 | Higashi .................. | H04N 25/78 |

(Continued)

*Primary Examiner* — Khai M Nguyen
(74) *Attorney, Agent, or Firm* — Fish & Richardson P.C.

(57)     ABSTRACT

Disclosed is an analog-to-digital converter (ADC) circuit for digitizing a pixel signal into a digital signal of positive integer (N) bits. The ADC includes a ramp generator, a clock, a comparator, and a counter. A system clock signal allows the ramp generator to generate a ramp signal and the clock generator to generate first to N-th clock signals. The comparator generates a comparison signal based on a comparison of the pixel signal, received from a pixel array, and the ramp signal. The counter includes an additional latch circuit and first to N-th latch circuits. The additional latch circuit generates an additional binary signal based on the system clock signal and the comparison signal, and the first to N-th latch circuits generate first to N-th latch signals based on the comparison signal and corresponding clock signal.

20 Claims, 14 Drawing Sheets

(56)        References Cited

U.S. PATENT DOCUMENTS

| | | | |
|---|---|---|---|
| 11,133,822 B2 | 9/2021 | Nakano | |
| 11,431,936 B2 | 8/2022 | Fan et al. | |
| 11,632,512 B2 | 4/2023 | Fan et al. | |

* cited by examiner

ANALOG-TO-DIGITAL CIRCUIT AND OPERATION METHOD THEREOF

CROSS-REFERENCE TO RELATED APPLICATIONS

This application claims priority under 35 U.S.C. § 119 to Korean Patent Application No. 10-2023-0096913 filed on Jul. 25, 2023, in the Korean Intellectual Property Office, the disclosure of which is incorporated by reference herein in its entirety.

BACKGROUND

An image sensor may receive a light through a photodiode of a pixel circuit and may generate an image. An analog-to-digital (ADC) circuit may convert an analog voltage corresponding to the light into a digital signal. To express various levels of brightness, there is a need to improve the resolution of the ADC circuit.

SUMMARY

An ADC circuit including an additional latch circuit is described including an image sensor and an operation method of the image sensor.

In general, in some aspects, the subject matter of the present disclosure is directed to an ADC circuit that includes: a ramp generator that generates a ramp signal based on a system clock signal; a clock generator that generates first to N-th clock signals based on the system clock signal; a comparator that generates a comparison signal based on a result of comparing a pixel signal received from a pixel array and the ramp signal; and a counter that includes an additional latch circuit and first to N-th latch circuits. The additional latch circuit generates an additional binary signal based on the system clock signal and the comparison signal, and the first to N-th latch circuits respectively generate first to N-th latch signals based on the comparison signal and corresponding clock signal among the first to N-th clock signals. "N" is an arbitrary natural number.

In general, in some aspects, the subject matter of the present disclosure is directed to an image sensor that includes: a pixel array having a plurality of pixel columns respectively generating a plurality of pixel signals; an ADC circuit that includes a ramp generator generating a ramp signal based on a system clock signal; a clock generator generating first to N-th clock signals based on the system clock signal; and a plurality of ADCs. A first ADC among the plurality of ADCs includes a first comparator that generates a first comparison signal based on a result of comparing a first pixel signal from a first pixel column among the plurality of pixel columns and the ramp signal from the ramp generator, a first additional latch circuit that generates a first additional binary signal based on the system clock signal and the first comparison signal, and first to N-th latch circuits that respectively generate first to N-th latch signals based on the first comparison signal and corresponding clock signal among the first to N-th clock signals. "N" is an arbitrary natural number.

In general, in some aspects, the subject matter of the present application is directed to an operation method of an analog-to-digital converter (ADC) circuit is presented. The ADC circuit includes a ramp generator, a clock generator, a comparator, and a counter. The method includes generating, by the ramp generator, a ramp signal based on a system clock signal, generating, by the clock generator, first to N-th clock signals based on the system clock signal, generating, by the comparator, a comparison signal based on a result of comparing a pixel signal received from a pixel array and the ramp signal, and generating, by the counter, an additional binary signal and first to N-th latch signals based on the comparison signal, the system clock signal, and the first to N-th clock signals. The counter includes an additional latch circuit that generates the additional binary signal based on the system clock signal and the comparison signal, and first to N-th latch circuits that respectively generate the first to N-th latch signals based on the comparison signal and corresponding clock signal among the first to N-th clock signals. "N" is an arbitrary natural number.

BRIEF DESCRIPTION OF THE FIGURES

The above and other objects and features of the present disclosure will become apparent by describing in detail embodiments thereof with reference to the accompanying drawings.

FIG. 3A is a block diagram illustrating an example of an ADC circuit of FIG. 1.

FIG. 8 is a block diagram illustrating an example ADC circuit of FIG. 1.

DETAILED DESCRIPTION

Below, various implementations of the present disclosure will be described in detail and clearly to such an extent that one skilled in the art carries out embodiments of the present disclosure easily.

Components described in the detailed description or accompanying claims with reference to the terms "part", "unit", "module", etc. and function blocks illustrated in accompanying drawings may be implemented in the form of software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a MEMS (microelectromechanical system), a passive element, or a combination thereof.

Figure 1:
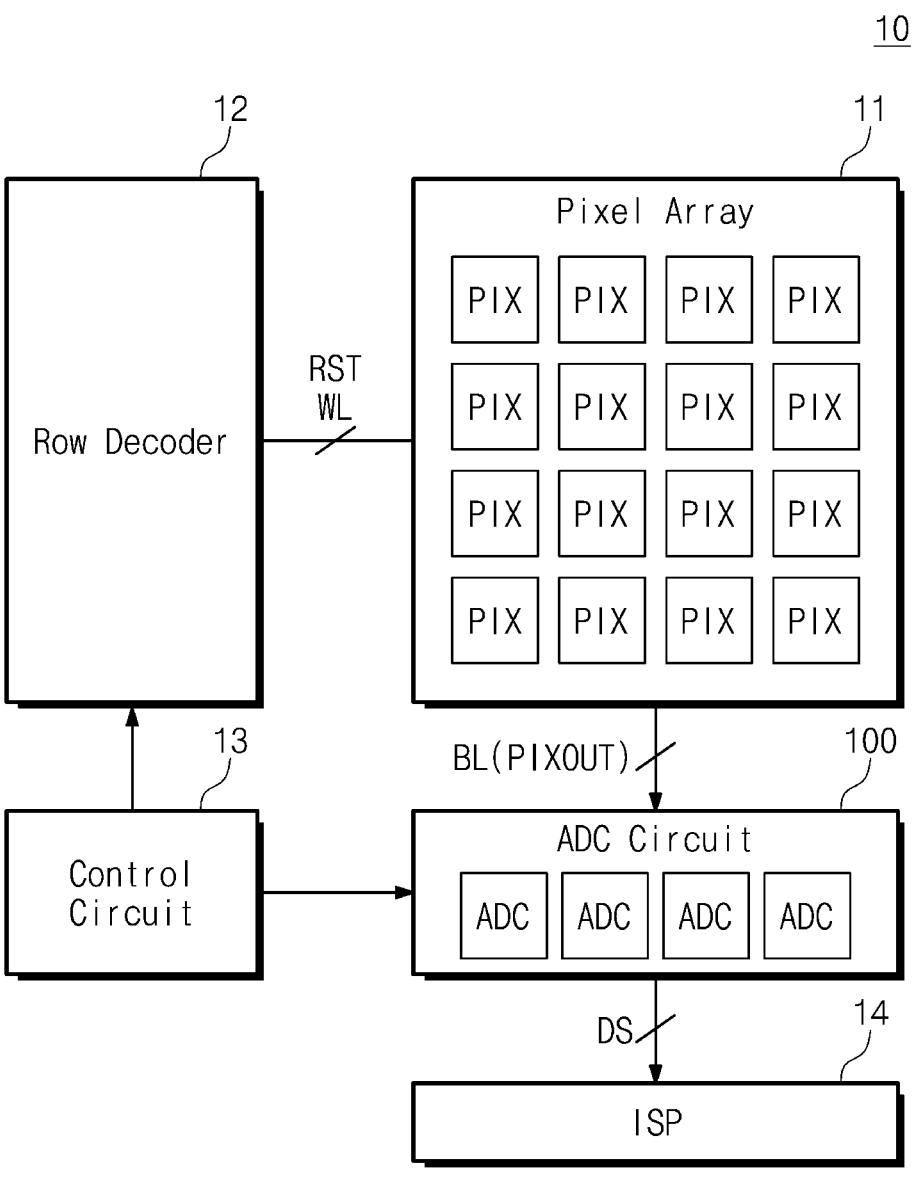
FIG. 1 is a block diagram illustrating an example of an image sensor.

FIG. 1 is a block diagram illustrating an image sensor to which an ADC circuit is applied.

FIG. 1 is a block diagram illustrating an image sensor 10 to which an analog-to-digital converter (ADC) circuit 100 is applied. Below, to describe the technical idea of the present disclosure easily, implementations of the present disclosure will be described based on the ADC circuit 100 included in the image sensor 10. However, the present disclosure is not limited thereto. For example, the ADC circuit 100 according to the present disclosure may be applied to various sensors, various signal processing devices, etc. to perform an operation of converting an analog signal into a digital signal.

Referring to FIG. 1, the image sensor 10 may include a pixel array 11, a row decoder 12, a control circuit 13, an image signal processor (ISP) 14, and the ADC circuit 100. The pixel array 11 may include a plurality of pixel circuits PIX and may be in the form of a matrix including a plurality of pixel rows and a plurality of pixel columns. In other words, the plurality of pixel circuits PIX may be arranged in a row direction and a column direction. Pixel circuits located at the same column may be connected to the same bit line BL. Pixel circuits located at the same row may be connected to the same reset line RST or the same word line WL. Each of the plurality of pixel circuits PIX of the pixel array 11 may output a pixel signal PIXOUT depending on the intensity or the amount of light incident from the outside. In this case, the pixel signal PIXOUT may be an analog signal corresponding to the intensity or the amount of light incident from the outside.

The pixel array 11 that includes 16 pixel circuits PIX arranged in a matrix with four rows and four columns is illustrated in FIG. 1, but the present disclosure is not limited thereto. For example, the number of pixel circuits PIX may increase or decrease, and a structure in which the pixel circuits PIX are arranged may be implemented to be different from the above structure.

The row decoder 12 may be connected to the pixel array 11 through the reset lines RST and the word lines WL. The row decoder 12 may control the reset lines RST and the word lines WL under control of the control circuit 13. The control circuit 13 may control the row decoder 12 and the ADC circuit 100 such that an image of the outside is captured through the pixel array 11. In an implementation, lines that connect the row decoder 12 and the pixel array 11 may be variously changed and modified depending on a structure of the pixel circuits PIX included in the pixel array 11.

The ADC circuit 100 is connected to the pixel array 11 through the bit lines BL. The ADC circuit 100 may receive the pixel signals PIXOUT from the plurality of pixel circuits PIX of the pixel array 11 through the bit lines BL and may convert the received pixel signals PIXOUT into a digital signal DS. The ADC circuit 100 may output the digital signal DS to an external device. For example, the ADC circuit 100 may output the digital signal DS to the image signal processor 14.

The image signal processor 14 may receive the digital signal DS from the ADC circuit 100. The image signal processor 14 may perform an image signal processing operation based on the digital signal DS. For example, the image signal processor 14 may perform filtering, correction, etc. with respect to the digital signal DS and may generate image data in which a resolution is improved or an error decreases.

Figure 2:
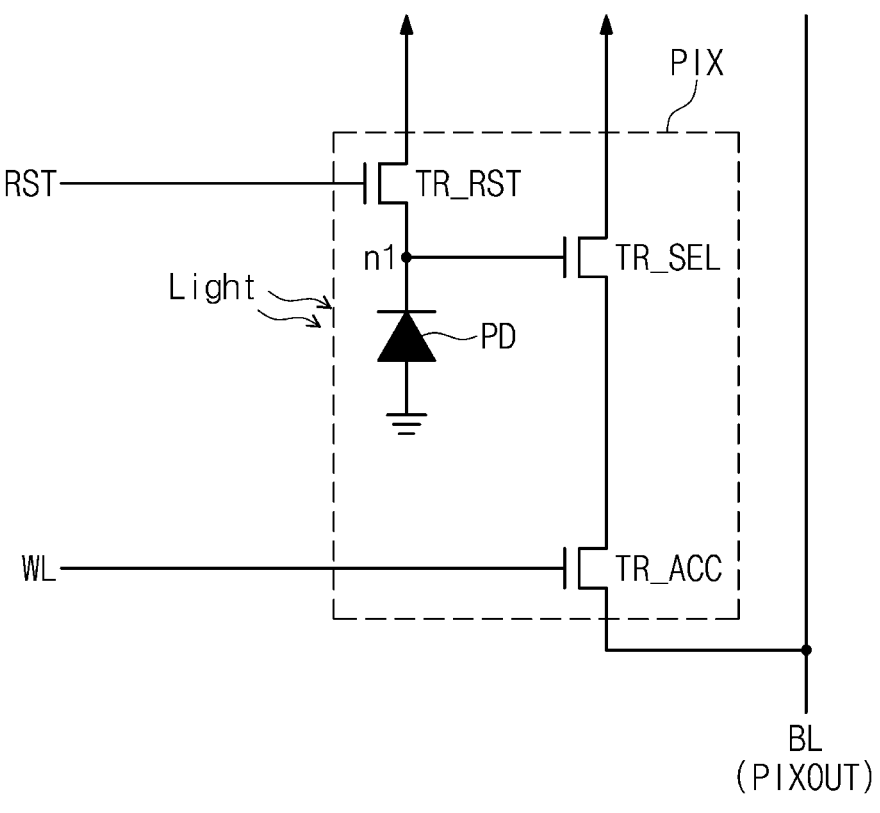
FIG. 2 is a diagram illustrating an example of a pixel circuit included in a pixel array of FIG. 1.

FIG. 2 is a diagram illustrating the pixel circuit PIX included in the pixel array 11 of FIG. 1. In an implementation, one among the plurality of pixel circuits PIX included in the pixel array 11 will be described with reference to FIG. 2. However, the present disclosure is not limited thereto.

Referring to FIG. 2, the pixel circuit PIX may include a photodiode PD, a reset transistor TR_RST, a select transistor TR_SEL, and an access transistor TR_ACC. In an implementation, the pixel circuit PIX illustrated in FIG. 2 may be an image pixel circuit of a three-transistor (3-TR) structure. However, the present disclosure is not limited thereto. For example, the pixel circuit PIX may be implemented in various structures (e.g., a one-transistor (1-TR) structure, a four-transistor (4-TR) structure, or a two-photodiode (2-PD) structure).

Referring to FIG. 2, the pixel circuit PIX may include the photodiode PD, the reset transistor TR_RST, the select transistor TR_SEL, and the access transistor TR_ACC. A first end of the reset transistor TR_RST is connected to a power supply voltage, and a second end thereof is connected to a first node n1. The reset transistor TR_RST may reset a voltage of the first node n1 to the power supply voltage in response to the reset signal.

The photodiode PD may be configured to supply charges to the first node n1 depending on the light received from the outside. A first end of the select transistor TR_SEL is connected to the power supply voltage, and a second end thereof is connected to a first end of the access transistor TR_ACC. The select transistor TR_SEL may be configured to operate based on the voltage of the first node n1. A second end of the access transistor TR_ACC is connected to the bit line BL. The access transistor TR_ACC may output the pixel signal PIXOUT through the bit line BL in response to a control signal of the word line WL. In an implementation, as described above, the pixel signal PIXOUT may be an analog signal corresponding to the intensity or the amount of light incident onto the photodiode PD.

Figure 3A:
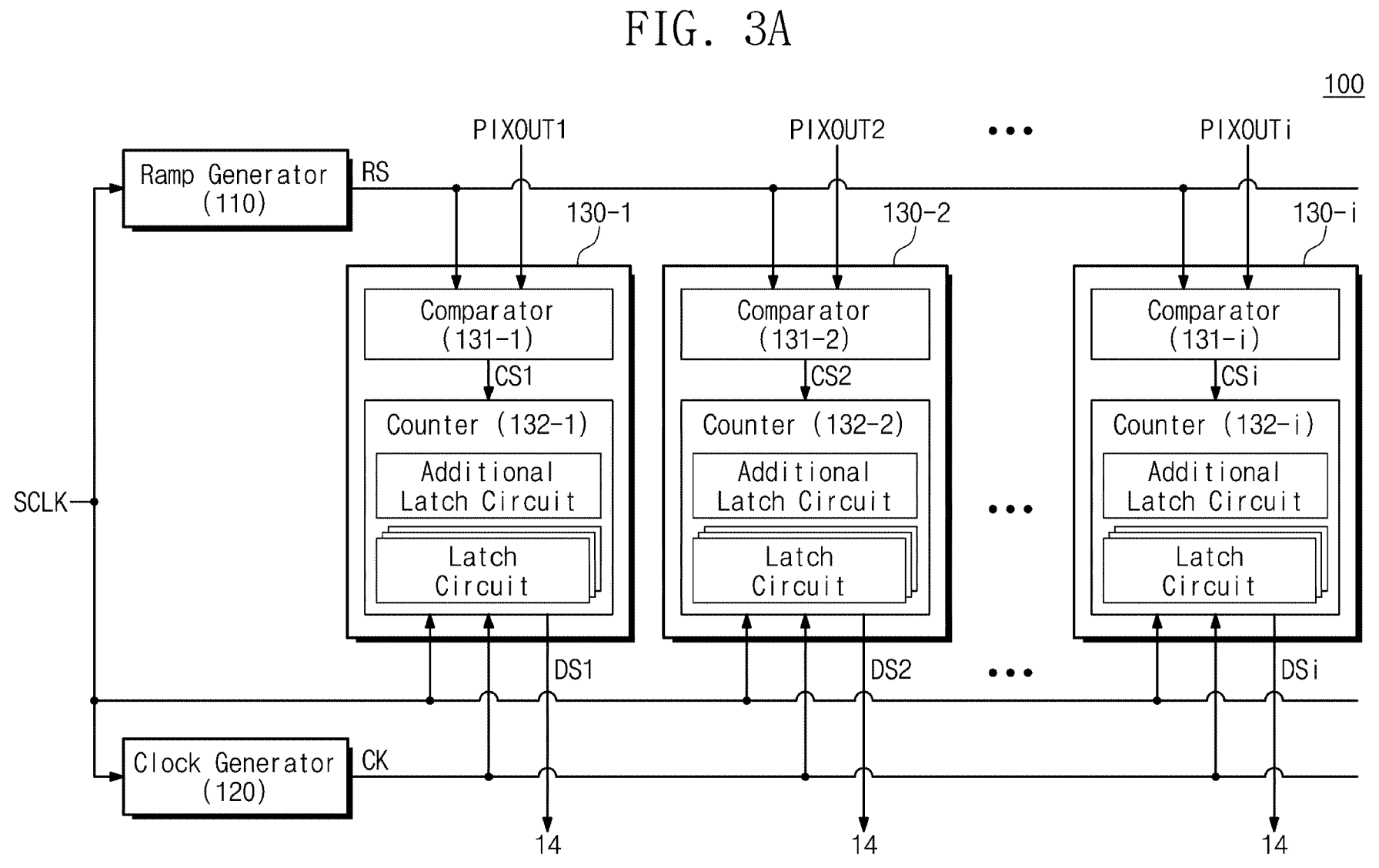

FIG. 3A is a block diagram illustrating an ADC circuit of FIG. 1. The ADC circuit 100 of FIG. 1 is illustrated in FIG. 3A.

The ADC circuit 100 may include a ramp generator 110, a clock generator 120, and a plurality of analog-to-digital converters 130-1 to 130-$i$.

The number of ADCs included in the ADC circuit 100 may be equal to the number of pixel columns of the pixel array 11 of FIG. 1. Herein, "i" may be an arbitrary natural number (i.e. a positive integer).

The ramp generator 110 may be configured generate a ramp signal RS based on a system clock signal SCLK. The system clock signal SCLK may correspond to the fastest clock that the image sensor 10 of FIG. 1 uses (i.e., a clock of the highest frequency that the image sensor 10 of FIG. 1 uses). For example, although not illustrated in FIG. 3A, the ramp generator 110 may receive the system clock signal SCLK from a phase locked loop (PLL) of the image sensor 10. The ramp signal RS may refer to a signal that increases or decreases linearly (or non-linearly) during a specific time based on the system clock signal SCLK. That is, the ramp signal RS may refer to a signal that increases or decreases along a given slope. The ramp generator 110 may generate the ramp signal RS based on preset values (e.g., a start level, an end level, and a slope). The ramp signal RS will be described in detail with reference to FIG. 4.

The clock generator 120 may be configured to generate a clock signal CK based on the system clock signal SCLK. The clock signal CK may include first to N-th clock signals. Each of the first to N-th clock signals may be a signal having a given period or a given frequency. The first to N-th clock signals will be described in detail with reference to FIGS. 4 and 5.

Below, a configuration and an operation of each of the plurality of ADCs 130-1 to 130-i will be described in detail.

The first ADC 130-1 among plurality of ADCs 130-1 to 130-i may include a first comparator 131-1 and a first counter 132-1.

The first comparator 131-1 may receive a first pixel signal PIXOUT1 from the first pixel column among the plurality of pixel columns. The first comparator 131-1 may be configured to generate a first comparison signal CS1 based on a result of comparing the first pixel signal PIXOUT1 and the ramp signal RS.

The first comparison signal CS1 may be used in the latch operation of an additional latch circuit and first to N-th latch circuits of the first counter 132-1. For example, when the first comparison signal CS1 transitions from the low level to the high level (i.e., when a rising edge is generated), the additional latch circuit and the first to N-th latch circuits may output digital values of relevant clock signals as latch signals, respectively. The first comparison signal CS1 will be described in detail with reference to FIGS. 5 and 6.

The first counter 132-1 may receive the first comparison signal CS1 from the first comparator 131-1, may receive the system clock signal SCLK from the PLL of the image sensor 10, and may receive the clock signal CK from the clock generator 120. The first counter 132-1 may generate a first digital signal DS1 based on the first comparison signal CS1, the system clock signal SCLK, and the clock signal CK. The first counter 132-1 may provide the first digital signal DS1 to the image signal processor 14.

The first counter 132-1 may include a first additional latch circuit and first to N-th latch circuits.

The first additional latch circuit may generate a first additional binary signal based on the system clock signal SCLK and the first comparison signal CS1. The first additional latch circuit may generate the first additional binary signal having a digital value of the system clock signal SCLK in response to the rising edge or the falling edge of the first comparison signal CS1. The first additional binary signal may have a digital value corresponding to one of "0" and "1". The first additional binary signal will be described in detail with reference to FIGS. 5 and 6.

Each of the first to N-th latch circuits may generate a latch signal based on the first comparison signal CS1 and the corresponding clock signal among the first to N-th clock signals included in the clock signal CK.

For example, the first latch circuit may generate a first latch signal based on the first clock signal and the first comparison signal CS1. The second latch circuit may generate a second latch signal based on the second clock signal and the first comparison signal CS1. As in the above description, the third to N-th latch circuits may respectively generate third to N-th latch signals.

Each of the first to N-th latch signals may have a digital value corresponding to one of "0" and "1". The first to N-th latch circuits will be described in detail with reference to FIGS. 5 and 6.

In some implementations, a first counter may provide an image signal processor with a first additional binary signal and first to N-th latch signals as the first digital signal DS1.

The first counter 132-1 may provide the image signal processor 14 with the first additional binary signal and the first to N-th latch signals as the first digital signal DS1.

Like the first ADC 130-1, the second ADC 130-2 may output a second digital signal DS2 based on a second pixel signal PIXOUT2. The second ADC 130-2 may include a second comparator 131-2 and a second counter 132-2. Operations of the second comparator 131-2 and the second counter 132-2 are similar to those of the first comparator 131-1 and the first counter 132-1.

The second comparator 131-2 may receive the second pixel signal PIXOUT2 from the second pixel column among the plurality of pixel columns. The second comparator 131-2 may generate a second comparison signal CS2 based on a result of comparing the second pixel signal PIXOUT2 and the ramp signal RS.

The second counter 132-2 may include a second additional latch circuit and first to N-th latch circuits.

The second additional latch circuit may generate a second additional binary signal based on the second comparison signal CS2 and the system clock signal SCLK.

As in the above description, the first to N-th latch circuits of the second counter 132-2 may respectively generate first to N-th latch signals based on the second comparison signal CS2 and the first to N-th clock signals.

The second counter 132-2 may provide the image signal processor 14 with the second additional binary signal and the first to N-th latch signals as the second digital signal DS2.

As in the above description, the third to i-th ADCs 130-3 to 130-i may generate third to i-th digital signals DS3 to DSi based on the third to i-th pixel signals PIXOUT3 to PIXOUTi.

The plurality of ADCs 130-1 to 130-i will be described in detail with reference of FIG. 5.

Figure 3B:
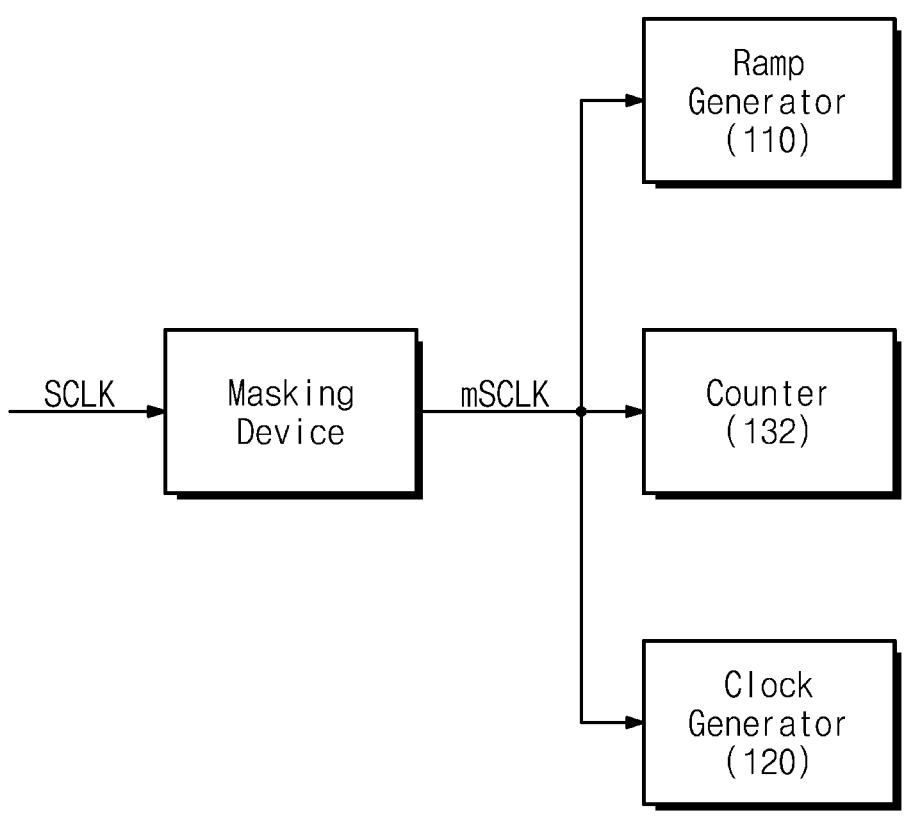
FIG. 3B is a block diagram describing an example of a system clock signal of FIG. 3A.

FIG. 3B is a diagram describing the system clock signal SCLK of FIG. 3A. The system clock signal SCLK will be described with reference to FIG. 3B.

The ADC circuit 100 of FIG. 3A may further include a masking device. The masking device may receive the system clock signal SCLK from the PLL of the image sensor 10. The masking device may generate a masked system clock signal mSCLK based on the system clock signal SCLK. The masking device may output the system clock signal SCLK as the masked system clock signal mSCLK in a first time period. The first time period may be determined in advance. For example, the masking device may output the system clock signal SCLK as the masked system clock signal mSCLK from a first time to a second time. The masking device may output the masked system clock signal mSCLK having the low level in the remaining time period other than the first time period.

The masking device may provide the ramp generator 110, a counter 132, and the clock generator 120 with the masked system clock signal mSCLK as the system clock signal SCLK of FIG. 3A. One counter 132 is illustrated in FIG. 3B, but the counter 132 may correspond to the first to i-th counters 132-1 to 132-i of FIG. 3A. The masking device may provide the masked system clock signal mSCLK to each of the first to i-th counters 132-1 to 132-i of FIG. 3A.

Figure 4:
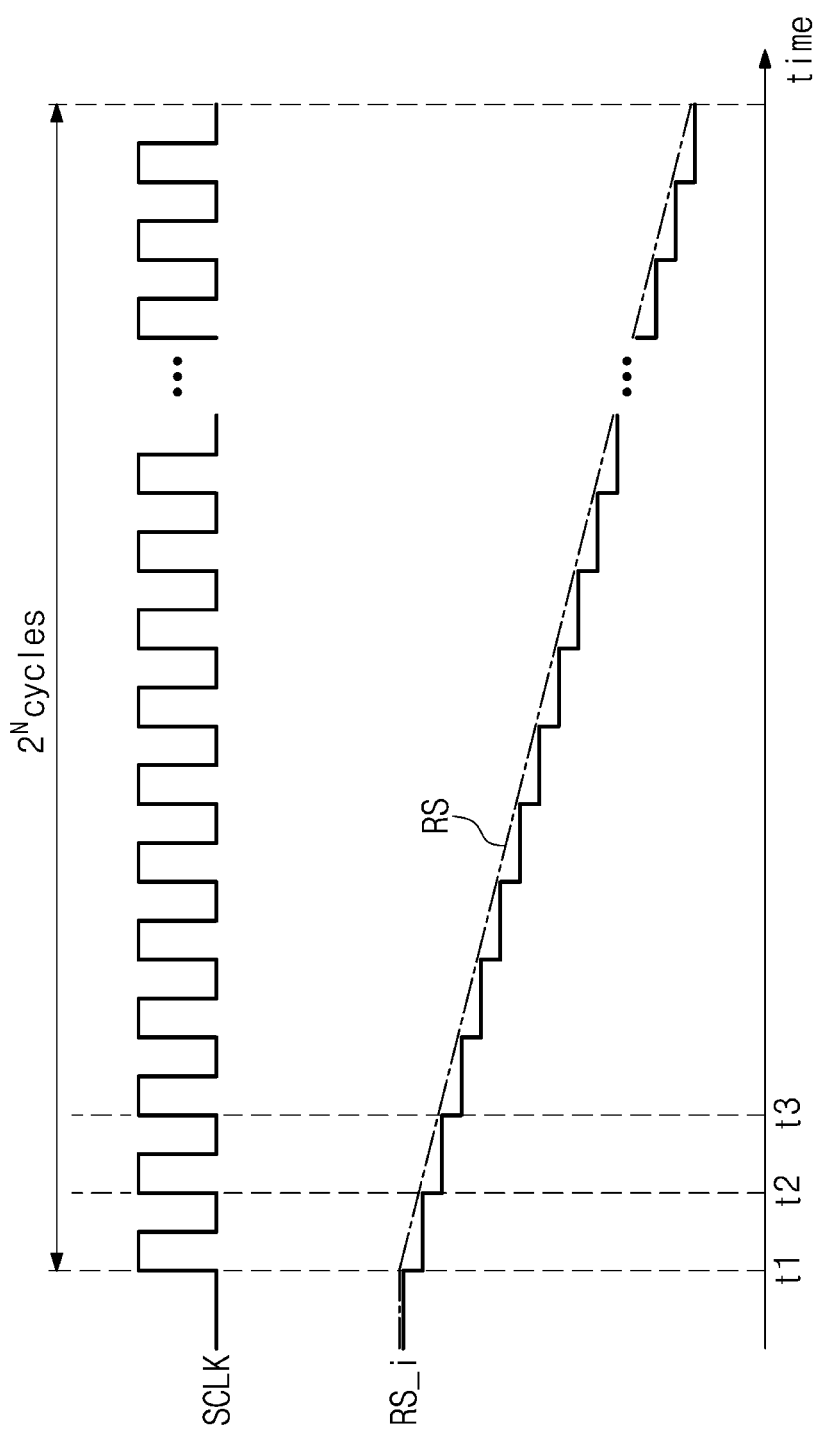
FIG. 4 is a timing diagram for describing an example of a ramp signal of FIG. 3A.

FIG. 4 is a timing diagram for describing a ramp signal of FIG. 3A. The ramp signal RS of FIG. 3A and an ideal ramp signal RS_i will be described with reference to FIG. 4 together with the system clock signal SCLK.

The system clock signal SCLK may be a signal having a given period or a given frequency. The system clock signal SCLK may periodically include the rising edge and the falling edge. For example, the system clock signal SCLK includes the rising edge at the first point in time t1, the second point in time t2, and the third point in time t3.

The ideal ramp signal RS_i may decrease as much as a given magnitude (or decrement) in response to the rising edge of the system clock signal SCLK. For example, at each of the first to third points in time t1 to t3, the ideal ramp signal RS_i may decrease as much as the given magnitude. In other words, the ideal ramp signal RS_i may be in the form of a stair in which the ideal ramp signal RS_i periodically decreases as much as the given magnitude until reaching the end level from the start level in synchronization with the system clock signal SCLK. Referring to FIG. 4, the ideal ramp signal RS_i is marked by a solid line.

However, actually, the ramp generator 110 of FIG. 3A may include a resistor and a capacitor provided at an output stage. Because the resistor and the capacitor operate in a similar fashion as a low pass filter, unlike the ideal ramp signal RS_i, the ramp generator 110 may output the ramp signal RS that decreases linearly (or non-linearly). Referring to FIG. 4, the ramp signal RS is marked by a dash-single dotted line.

The ramp signal RS and the ideal ramp signal RS_i are illustrated in FIG. 4 as decreasing in response to the rising edge of the system clock signal SCLK, but the present disclosure is not limited thereto. For example, the ramp signal RS and the ideal ramp signal RS_i may increase in synchronization with the rising edge of the system clock signal SCLK. Alternatively, the ramp signal RS and the ideal ramp signal RS_i may decrease in synchronization with the falling edge of the system clock signal SCLK.

An N-bit digital signal may include N bits. For example, the N-bit digital signal may include first to N-th bits. In this case, the first bit may be a least significant bit (LSB) of the N-bit digital signal. The N-th bit may be a most significant bit (MSB) of the N-bit digital signal. An N-bit binary code and an N-bit Gray code to be described later are similar to the N-bit digital signal.

In the case of a general ADC circuit, the system clock signal SCLK is required as much as 2N cycles (or periods) to generate the N-bit digital signal.

In other words, a time corresponding to 2N times the period of the system clock signal SCLK may be required to generate the N-bit digital signal. Accordingly, a time corresponding to 2N+1 times the period of the system clock signal SCLK is required for the general ADC circuit to generate a (N+1)-bit digital signal. That is, when the number of bits of a digital signal increases by one, a time taken to generate the digital signal may double. The time taken to generate the digital signal may be decreased by using the high-speed system clock signal SCLK whose frequency is increased as much as two times, but power consumption increases.

The ADC circuit according to the present disclosure may generate an (N+1)-bit digital signal while maintaining the general ADC generating the N-bit digital signal, the frequency of the system clock signal SCLK, and the time required to generate a digital signal. That is, the resolution of the ADC circuit may be improved in a state where the time required and power consumption are maintained.

Figure 5:
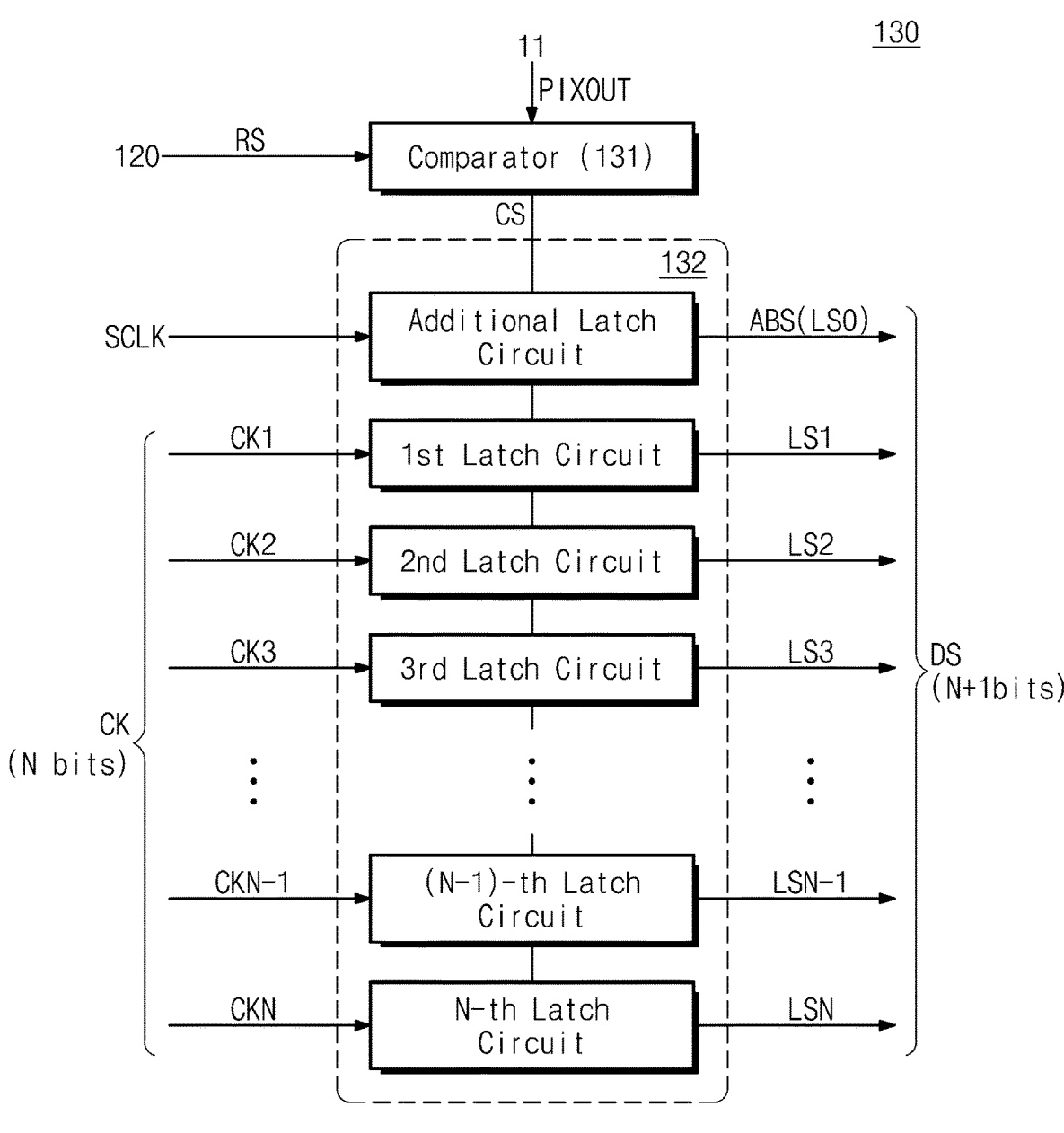
FIG. 5 is a block diagram illustrating one of a plurality of ADCs of FIG. 3A.

FIG. 5 is a block diagram illustrating one of a plurality of ADCs of FIG. 3A. One ADC among the plurality of ADCs 130-1 to 130-$i$ of FIG. 3A is illustrated in FIG. 5. For convenience of description, one ADC is referred to as an "ADC 130". However, the present disclosure is not limited thereto. For example, the remaining ADCs included in the ADC circuit 100 of FIG. 3A may be similar in structure to the ADC 130 of FIG. 4. For brevity of description, with regard to a comparator 131 and the counter 132, the description given with reference to the first comparator 131-1 and the first counter 132-1 of FIG. 3A will be omitted to avoid redundancy.

The ADC 130 may include the comparator 131 and the counter 132.

When the voltage level of the ramp signal RS is identical to the voltage level of the pixel signal PIXOUT, the comparator 131 may generate the comparison signal CS transitioning from the low level to the high level (i.e., having the rising edge).

The counter 132 may include an additional latch circuit and first to N-th latch circuits.

The additional latch circuit may generate an additional binary signal ABS based on the system clock signal SCLK and the comparison signal CS. The additional binary signal ABS may be referred to as a "0-th latch signal LS0".

In some implementations, in response to the rising edge (or falling edge) of the comparison signal CS, the additional latch circuit may output, as an additional binary signal, a digital value that the system clock signal SCLK has when the rising edge (or falling edge) is generated.

For example, under the condition that the comparison signal CS has the low-to-high transition (or high-to-low transition), when the system clock signal SCLK is at the high level, the additional latch circuit may generate the additional binary signal ABS having a digital value of "1". In contrast, under the condition that the comparison signal CS has the low-to-high transition (or high-to-low transition), when the system clock signal SCLK is at the low level, the additional latch circuit may generate the additional binary signal ABS having a digital value of "0".

The additional binary signal ABS may correspond to one of bits of the digital signal DS. In this case, the digital signal DS may include (N+1) bits.

The additional binary signal ABS may correspond to the LSB of the digital signal DS. In other words, the additional binary signal ABS may correspond to the 0-th bit of the digital signal DS.

The first to N-th latch circuits may respectively receive first to N-th clock signals CK1 to CKN from the clock generator 120 of FIG. 3A. The first to N-th latch circuits may respectively generate first to N-th latch signals based on the comparison signal CS and the first to N-th clock signals CK1 to CKN.

A clock generator (e.g., the clock generator 120 of FIG. 3A) may generate the first to N-th clock signals CK1 to CKN based on the system clock signal SCLK, by using a binary code algorithm.

The binary code algorithm may refer to an algorithm for converting a decimal number into an N-bit binary code. For example, the first clock signal CK1 may correspond to the first bit of the N-bit binary code. The second clock signal CK2 may correspond to the second bit of the N-bit binary code. As in the above description, the third to N-th clock signals CK3 to CKN may respectively correspond to the third to N-th bits of the N-bit binary code. This will be described in detail with reference to FIG. 6.

In some implementations, in response to the rising edge (or falling edge) of the comparison signal CS, the first to N-th latch circuits may output, as the first to N-th latch signals LS1 to LSN, digital values of the first to N-th clock signals CK1 to CKN, which correspond to a point in time when the rising edge (or falling edge) is generated.

For example, when the comparison signal CS has the low-to-high transition (or high-to-low transition), the first latch circuit may output the digital value of the first clock signal CK1 as the first latch signal LS1. In detail, under the condition that the comparison signal CS has the low-to-high transition (or high-to-low transition), when the first clock signal CK1 is at the high level, the first latch circuit may store a digital value of "1" as the first latch signal LS1. In contrast, under the condition that the comparison signal CS has the low-to-high transition (or high-to-low transition), when the first clock signal CK1 is at the low level, the first latch circuit may store a digital value of "0" as the first latch signal LS1.

For example, when the comparison signal CS has the low-to-high transition (or high-to-low transition), the second latch circuit may output the digital value of the second clock signal CK2 as the second latch signal LS2. In detail, under the condition that the comparison signal CS has the low-to-high transition (or high-to-low transition), when the second clock signal CK2 is at the high level, the second latch circuit may store a digital value of "1" as the second latch signal LS2. In contrast, under the condition that the comparison signal CS has the low-to-high transition (or high-to-low transition), when the second clock signal CK2 is at the low level, the second latch circuit may store a digital value of "0" as the second latch signal LS2.

As in the above description, the third latch circuit may output, as the third latch signal LS3, the digital value of the third clock signal CK3, which corresponds to a point in time when the comparison signal CS has the low-to-high transition (or high-to-low transition). Likewise, the fourth to N-th latch circuits may respectively generate the fourth to N-th latch signals LS4 to LSN.

The first to N-th latch signals LS1 to LSN may respectively correspond to the first to N-th bits of the (N+1)-bit digital signal DS.

The counter 132 may provide the image signal processor 14 of FIG. 3A with the additional binary signal ABS and the first to N-th latch signals LS1 to LSN.

The additional binary signal ABS and the first to N-th latch signals LS1 to LSN may have logical sequentiality within the digital signal DS. The number of bits of the digital signal DS is (N+1). The additional binary signal ABS may correspond to the first bit value (the least significant bit) of the digital signal DS, and the first to N-th latch signals LS1 to LSN may respectively correspond to the second to (N+1)-th bit values of the digital signal DS.

Figure 6:
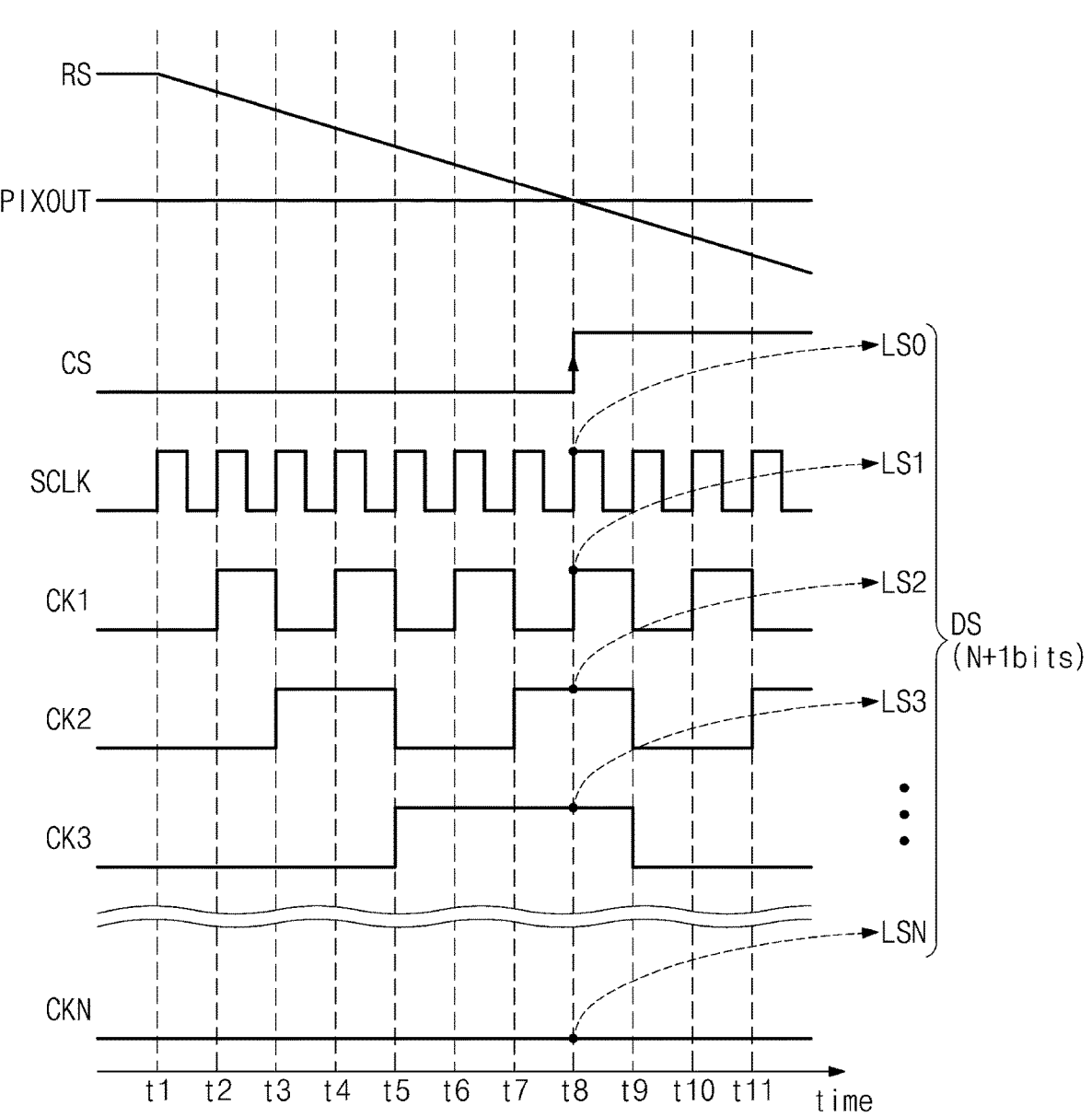
FIG. 6 is a timing diagram describing an example of an operation of an ADC circuit of FIG. 5.

FIG. 6 is a timing diagram for describing an operation of the ADC circuit 100 of FIG. 3A. An operation of the ADC circuit 100 will be described with reference to FIG. 6. Signals illustrated in FIG. 6 correspond to signals with the same reference signs illustrated in FIGS. 3A and 5. For brevity, the description that is the same as the description given with reference to FIGS. 3A and 5 will be omitted to avoid redundancy.

The ramp signal RS decreases along the given slope over time from the start level that is greater than that of the pixel signal PIXOUT. At the eighth point in time t8, the voltage level of the ramp signal RS is identical to the voltage level of the pixel signal PIXOUT.

A comparator may generate the comparison signal CS of a low level when the voltage level of the ramp signal RS is greater than the voltage level of the pixel signal PIXOUT. In contrast, the comparator may generate the comparison signal CS of a high level when the voltage level of the ramp signal RS is not greater than the voltage level of the pixel signal PIXOUT.

However, the present disclosure is not limited thereto. In contrast, the comparator may generate the comparison signal CS of a high level when the voltage level of the ramp signal RS is greater than the voltage level of the pixel signal PIXOUT. Likewise, the comparator may generate the comparison signal CS of a low level when the voltage level of the ramp signal RS is not greater than the voltage level of the pixel signal PIXOUT.

For example, the comparison signal CS has the low level in the time period from t1 to t8, in which the voltage level of the ramp signal RS is greater than the voltage level of the pixel signal PIXOUT. The comparison signal CS has the high level in the time period from 8 to t11, in which the voltage level of the ramp signal RS is not greater than the voltage level of the pixel signal PIXOUT.

The system clock signal SCLK has the low-to-high transition (i.e., the rising edge) at each of the first to eleventh points in time t1 to t11.

The first to N-th clock signals CK1 to CKN may respectively correspond to the first to N-th bits of the N-bit binary code. The N-bit binary code may include N bits. The N-bit binary code may correspond to a decimal number. A value of the decimal number may be "0" at the first point in time t1 and may increase by one every rising edge of the system clock signal SCLK.

The first to N-th clock signals CK1 to CKN may respectively correspond to the first to N-th bits of the N-bit binary code.

For example, from the first point in time t1 to before the second point in time t2, the N-bit binary code may correspond to the decimal number of "0". In other words, the N-bit binary code is [0, . . . 0, 0, 0]; in this case, each of the first to N-th clock signals CK1 to CKN is at the low level.

From the second point in time t2 to before the third point in time t3, the N-bit binary code may correspond to the decimal number of "1". In other words, the N-bit binary code is [0, . . . 0, 0, 1]; in this case, the first clock signal CK1 is at the high level, and the remaining clock signals CK2 to CKN are at the low level.

From the third point in time t3 to before the fourth point in time t4, the N-bit binary code may correspond to the decimal number of "2". In other words, the N-bit binary code is [0, . . . 0, 1, 0]; in this case, the first clock signal CK1 is at the low level, the second clock signal CK2 is at the high level, and the remaining clock signals CK3 to CKN are at the low level.

From the fourth point in time t4 to before the fifth point in time t5, the N-bit binary code may correspond to the decimal number of "3". In other words, the N-bit binary code is [0, . . . 0, 1, 1]; in this case, the first clock signal CK1 is at the high level, the second clock signal CK2 is at the high level, and the remaining clock signals CK3 to CKN are at the low level.

From the fifth point in time t5 to before the sixth point in time t6, the N-bit binary code may correspond to the decimal number of "4". In other words, the N-bit binary code is [0, . . . 1, 0, 0]; in this case, the first clock signal CK1 is at the low level, the second clock signal CK2 is at the low level, the third clock signal CK3 is at the high level, and the remaining clock signals CK4 to CKN are at the low level.

From the sixth point in time t6 to before the seventh point in time t7, the N-bit binary code may correspond to the decimal number of "5". In other words, the N-bit binary code is [0, . . . 1, 0, 1]; in this case, the first clock signal CK1 is at the high level, the second clock signal CK2 is at the low level, the third clock signal CK3 is at the high level, and the remaining clock signals CK4 to CKN are at the low level.

From the seventh point in time t7 to before the eighth point in time t8, the N-bit binary code may correspond to the decimal number of "6". In other words, the N-bit binary code is [0, 1, 1, 0]; in this case, the first clock signal CK1 is at the low level, the second clock signal CK2 is at the high level, the third clock signal CK3 is at the high level, and the remaining clock signals CK4 to CKN are at the low level.

From the eighth point in time t8 to before the ninth point in time t9, the N-bit binary code may correspond to the decimal number of "7". In other words, the N-bit binary code is [0, . . . 1, 1, 1]; in this case, the first clock signal CK1 is at the high level, the second clock signal CK2 is at the high level, the third clock signal CK3 is at the high level, and the remaining clock signals CK4 to CKN are at the low level.

As in the above description, after the ninth point in time t9, the first to N-th clock signals CK1 to CKN may respectively correspond to the bits of the N-bit binary code.

At the ninth point in time t8, because the system clock signal SCLK is at the high level, an additional latch circuit (e.g., the additional latch circuit of FIG. 5) may generate the additional binary signal ABS having a digital value of "1".

First to N-th latch circuits (e.g., the first to N-th latch circuits of FIG. 5) may respectively output, as the first to N-th latch signals LS1 to LSN, values of the first to N-th clock signals CK1 to CKN, which correspond to a point in time when the comparison signal CS transitions from the low level to the high level.

For example, at the eighth point in time t8, because the first clock signal CK1 is at the high level, the first latch circuit may generate the first latch signal LS1 having a digital value of "1". At the eighth point in time t8, because the second clock signal CK2 is at the high level, the second latch circuit may generate the second latch signal LS2 having a digital value of "1". At the eighth point in time t8, because the third clock signal CK3 is at the high level, the third latch circuit may generate the third latch signal LS3 having a digital value of "1". At the eighth point in time t8, because the N-th clock signal CKN is at the low level, the N-th latch circuit may generate the N-th latch signal LSN having a digital value of "0".

Although not illustrated in FIG. 6, as in the above description, the fourth to (N−1)-th latch circuits may respectively generate the fourth to (N−1)-th latch signals LS4 to LSN-1.

A counter (e.g., a counter of FIG. 3A) may provide an image signal processor with the additional binary signal ABS and the first to N-th latch signals LS1 to LSN as the (N+1)-bit digital signal DS.

In the digital signal DS, the additional binary signal ABS may be included as the 0-th bit, and the first to N-th latch signals LS1 to LSN may be respectively included as the first to N-th bits. That is, the additional binary signal ABS may correspond to the LSB of the digital signal DS. According to the above description, the additional binary signal ABS may be also referred to as a "0-th latch signal LS0".

For convenience, the description is given with reference to FIG. 6 as the ramp signal RS decreases over time, the comparison signal CS includes the rising edge, and the first to N-th clock signals CK1 to CKN change in response to the rising edge of the system clock signal SCLK. However, the present disclosure is not limited thereto. For example, the ramp signal RS may increase over time; in this case, the comparison signal CS may include the falling edge, and the first to N-th clock signals CK1 to CKN may change in response to the falling edge of the system clock signal SCLK.

Figure 7:
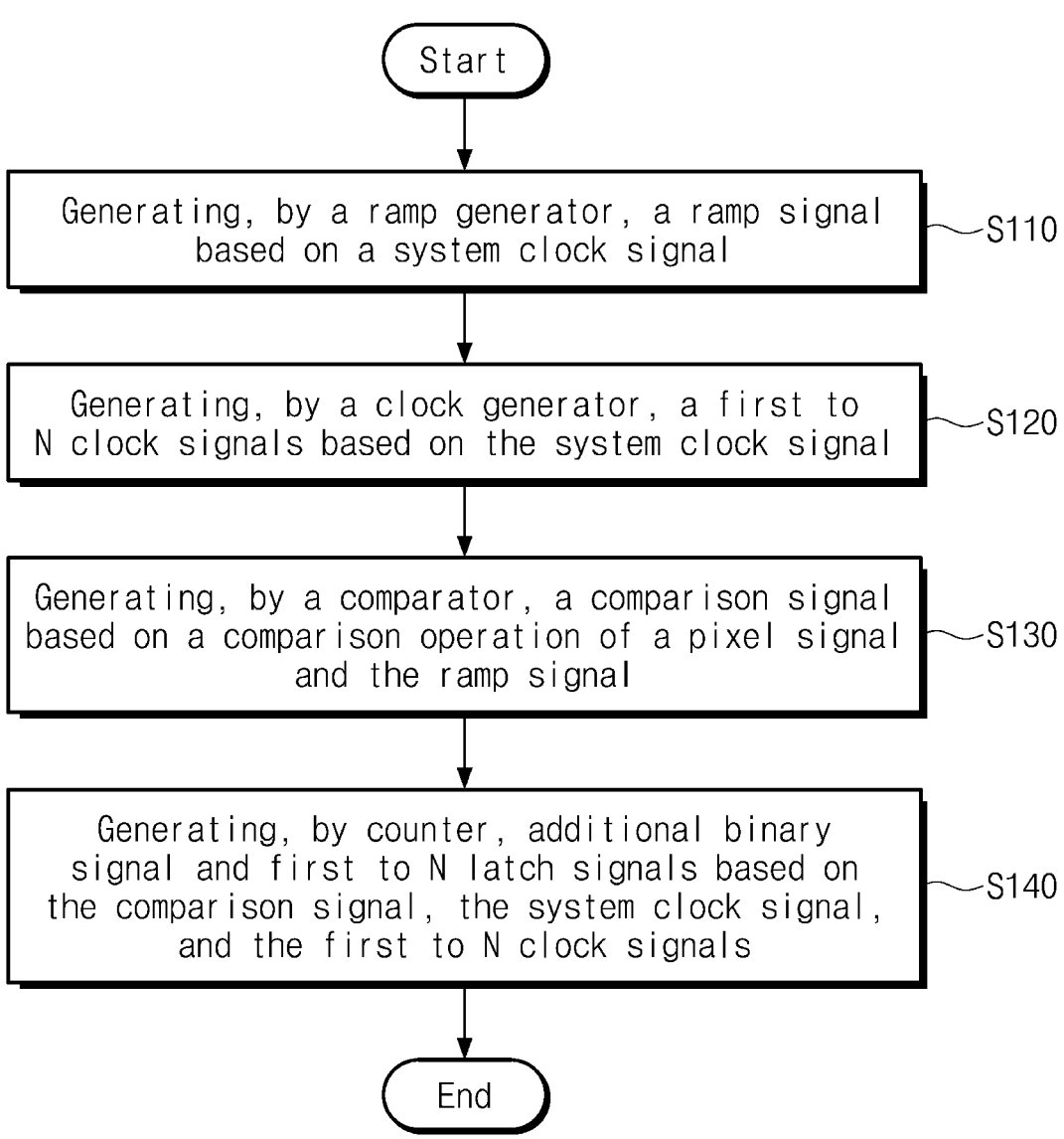
FIG. 7 is a flowchart illustrating an example operation of an ADC circuit of FIG. 3A.

FIG. 7 is a flowchart illustrating an operation of an ADC circuit of FIG. 3A. An operation method of the ADC circuit 100 will be described with reference to FIGS. 3A and 7.

In operation S110, a ramp generator of an ADC circuit may generate a ramp signal based on a system clock signal.

In operation S120, a clock generator of the ADC circuit may generate first to N-th clock signals based on the system clock signal.

The first to N-th clock signals may respectively correspond to first to N-th bits of an N-bit binary code.

In operation S130, a comparator of the ADC circuit may generate a comparison signal based on a result of comparing a pixel signal with the ramp signal.

In some implementations, operation S130 may include outputting, by the comparator, the comparison signal of the low level in a time period where the ramp signal is greater than the pixel signal, and outputting, by the comparator, the comparison signal of the high level in a time period where the ramp signal is smaller than or equal to the pixel signal.

In operation S140, a counter of the ADC circuit may generate an additional binary signal and first to N-th latch signals based on the comparison signal, the system clock signal, and the first to N-th clock signals.

The counter may include an additional latch circuit and first to N-th latch circuits. The additional latch circuit may be configured to generate an additional binary signal based on the system clock signal and the comparison signal. The first to N-th latch circuits may be configured to respectively generate the first to N-th latch signals based on the comparison signal and the first to N-th clock signals.

In some implementations, operation S140 may further include providing an image signal processor with the additional binary signal and the first to N-th latch signals as a digital signal.

The additional binary signal and the first to N-th latch signals may have logical sequentiality within the digital signal.

For example, the additional binary signal may correspond to a first bit value (the least significant bit) of the (N+1)-bit digital signal, and the first to N-th latch signals may correspond to second to (N+1)-th bits of the (N+1)-bit digital signal.

Figure 8:
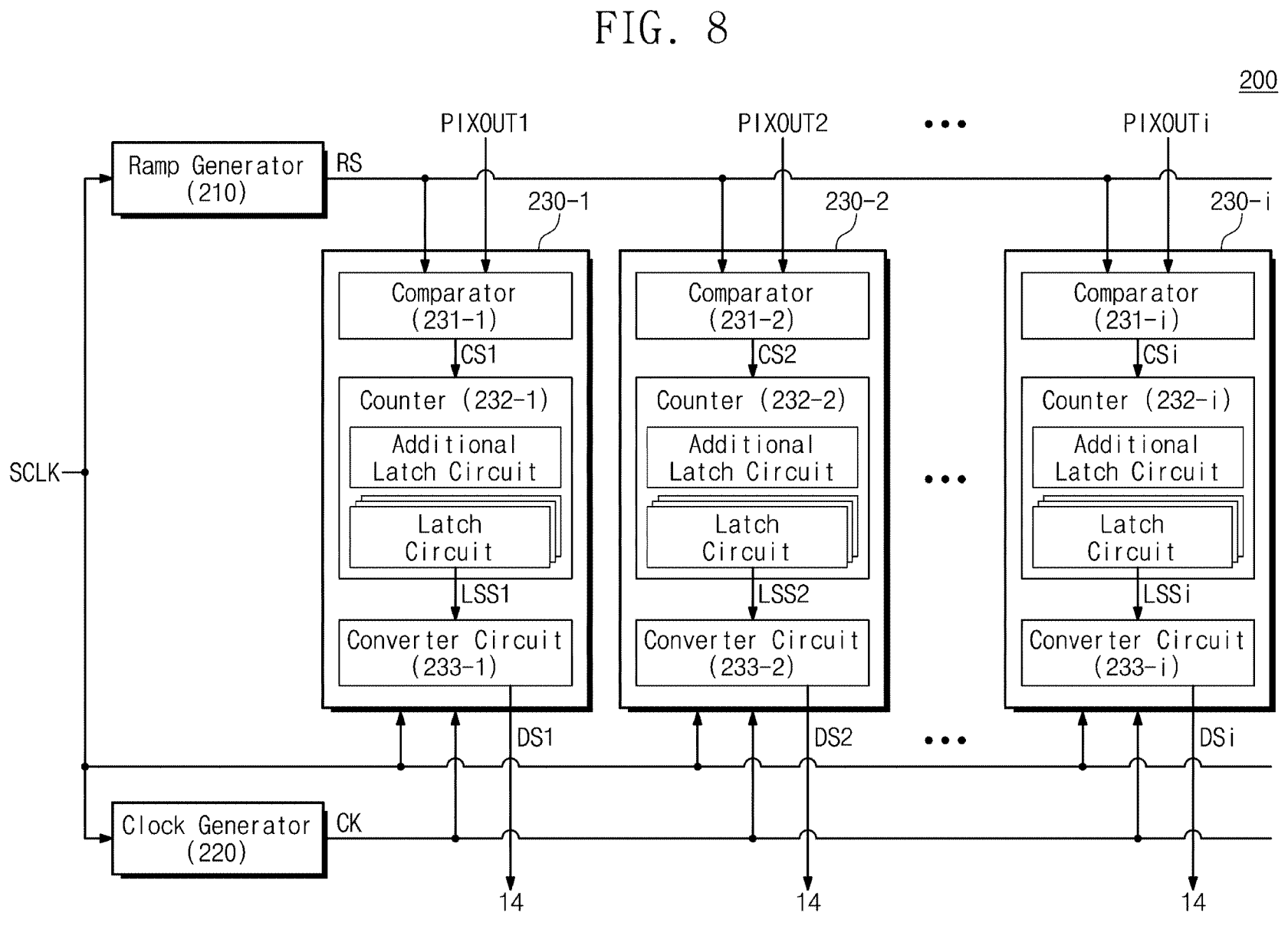

FIG. 8 is a block diagram illustrating an ADC circuit of FIG. 1. The ADC circuit 100 of FIG. 1 is illustrated in FIG. 8. A ramp generator 210, a first comparator 231-1, a second comparator 231-2, and a third comparator 231-3 of FIG. 8 may correspond to the ramp generator 110, the first comparator 131-1, the second comparator 131-2, and the third comparator 131-3 of FIG. 3A. For convenience, the description that is the same as the description given with reference to FIG. 3A will be omitted to avoid redundancy.

An ADC circuit 200 may include the ramp generator 210, a clock generator 220, and a plurality of ADCs 230-1 to 230-i.

The ramp generator 210 may provide the ramp signal RS to each of the plurality of ADCs 230-1 to 230-i.

The clock generator 220 may generate the clock signal CK based on the system clock signal SCLK and a gray code algorithm. The clock signal CK may include first to N-th clock signals.

The gray code algorithm may indicate an algorithm for generating the clock signal CK corresponding to an N-bit gray code. For example, the clock signal CK may include first to N-th clock signals. A gray code obtained based on the first to N-th clock signals may include bits that are set such that two or more bits do not simultaneously change in the corresponding binary code when a value of the corresponding decimal value changes as much as 1.

For example, when a value of the decimal number changes from "1" to "2", a 3-bit binary code may change from [0, 0, 1] to [0, 1, 0]. That is, the first bit and the second bit of the binary code change at the same time. However, in an implementation, the gray code may change from [0, 1, 0] to [0, 1, 1]. That is, only the first bit of the gray code changes.

As such, as a value of the decimal number sequentially changes as much as "1", the error and power consumption of the ADC circuit 100 when the gray code is used may decrease compared to when the binary code is used.

The first to N-th clock signals may respectively correspond to the first to N-th bits of the N-bit gray code. The first to N-th clock signals will be described in detail with reference to FIGS. 9 and 10.

Referring again to FIG. 8, the first ADC 230-1 among the plurality of ADCs 230-1 to 230-*i* may generate the first digital signal DS1 based on the ramp signal RS, the first pixel signal PIXOUT1, the system clock signal SCLK, and the clock signal CK. The first ADC 230-1 may provide the first digital signal DS1 to the image signal processor 14.

The first ADC 230-1 among the plurality of ADCs 230-1 to 230-*i* may include the first comparator 231-1, a first counter 232-1, and a first converter circuit 233-1.

The first comparator 231-1 may compare the ramp signal RS and the first pixel signal PIXOUT1 to output the first comparison signal CS1. The first comparator 231-1 is the same as the first comparator 131-1 of FIG. 3A, and thus, additional description will be omitted to avoid redundancy.

The first counter 232-1 may include a first additional latch circuit and first to N-th latch circuits.

The first additional latch circuit may generate a first additional binary signal based on the system clock signal SCLK and the first comparison signal CS1. The first additional binary signal may have a digital value corresponding to "0" or "1".

In some implementations, when the first comparison signal CS1 has the low-to-high transition (or high-to-low transition), the first additional latch circuit may output a digital value of the system clock signal SCLK as the first additional binary signal. The first additional latch circuit will be described in detail with reference to FIGS. 9 and 10.

The first to N-th latch circuits may generate a first latch signal set LSS1 based on the first comparison signal CS1 and the first to N-th clock signals. The first latch signal set LSS1 may include first to N-th latch signals. Each of the first to N-th latch signals may have a digital value of "0" or "1".

In some implementations, when the first comparison signal CS1 has the rising edge (or falling edge), the first to N-th latch circuits may output corresponding digital values of the first to N-th clock signals CK1 to CKN as the first to N-th latch signals.

The first to N-th latch circuits will be described in detail with reference to FIGS. 9 and 10. The first to N-th latch circuits may provide the first latch signal set LSS1 to the first converter circuit 233-1.

The first converter circuit 233-1 may receive the first latch signal set LSS1. The first converter circuit 233-1 may generate first to N-th binary signals based on the first to N-th latch signals, by using a gray-to-binary (G2B) algorithm.

The G2B algorithm may indicate an algorithm capable of converting the N-bit gray code into the N-bit binary code (or expressing the N-bit binary code corresponding to the N-bit gray code). The G2B algorithm may be implemented with hardware, software, or a combination thereof.

The first to N-th binary signals may respectively correspond to first to N-th bits of the N-bit binary code. The N-bit binary code may include N bits. The first to N-th binary signals may respectively correspond to the first to N-th bits of the N-bit binary code.

The first converter circuit 233-1 will be described in detail with reference to FIG. 9.

The first ADC 230-1 may provide the image signal processor 14 of FIG. 1 with the first additional binary signal and the first to N-th latch signals as the first digital signal DS1.

Like the first ADC 230-1, the second ADC 230-2 may include the second comparator 231-2, a second counter 232-2, and a second converter circuit 233-2.

The second counter 232-2 may include a second additional latch circuit and first to N-th latch circuits.

The second additional latch circuit may generate a second additional binary signal based on the second comparison signal CS2 and the system clock signal SCLK.

As in the above description, the first to N-th latch circuits of the second counter 232-2 may generate a second latch signal set LSS2 based on the second comparison signal CS2 and the first to N-th clock signals. The second latch signal set LSS2 may include first to N-th latch signals.

The second counter 232-2 may provide the second latch signal set LSS2 to the second converter circuit 233-2.

The second converter circuit 233-2 may generate first to N-th binary signals based on the first to N-th latch signals, by using the G2B algorithm.

The second ADC 230-2 may provide the image signal processor 14 with the second additional binary signal and the first to N-th binary signals as the second digital signal DS2.

The second comparator 231-2 may provide the second comparison signal CS2 to the second counter 232-2. The second counter 232-2 may provide the second latch signal set LSS2 to the second converter circuit 233-2. The second converter circuit 233-2 may generate the first to N-th binary signals based on the second latch signal set LSS2. The second ADC 230-2 may provide the image signal processor 14 of FIG. 1 with the second additional binary signal and the first to N-th latch signals as the second digital signal DS2.

As in the above description, the third to i-th ADCs 230-3 to 230-*i* may generate the third to i-th digital signals DS3 to DSi based on the third to i-th pixel signals PIXOUT3 to PIXOUTi. For brevity, additional description associated with the third to i-th ADCs 230-3 to 230-*i* will be omitted to avoid redundancy.

Figure 9:
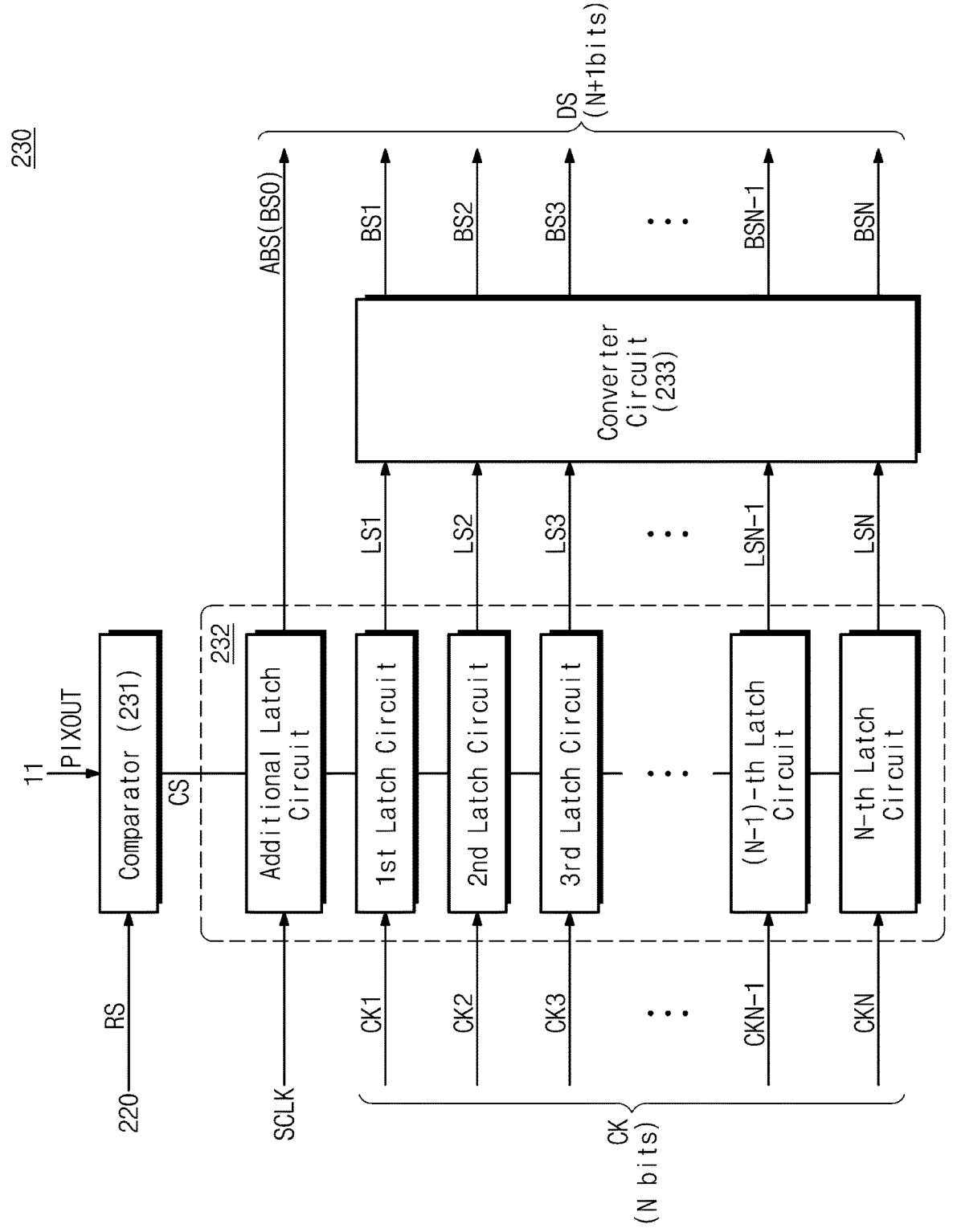
FIG. 9 is a block diagram illustrating one of a plurality of ADCs of FIG. 8.

FIG. 9 is a block diagram illustrating one of a plurality of ADCs of FIG. 8. One ADC among the plurality of ADCs 230-1 to 230-*i* of FIG. 8 is illustrated in FIG. 9. For convenience of description, one ADC is referred to as an "ADC 230". However, the present disclosure is not limited thereto. For example, the remaining ADCs included in the ADC circuit 200 of FIG. 8 may be similar in structure to the ADC 230 of FIG. 9. For brevity of description, with regard to a comparator 231, a counter 232, and a converter circuit 233, the description that is given with reference to the first comparator 231-1, the first counter 232-1, and the first converter circuit 233-1 of FIG. 8 will be omitted to avoid redundancy.

When the voltage level of the ramp signal RS is identical to the voltage level of the pixel signal PIXOUT, the comparator 231 may generate the comparison signal CS including the rising edge (or falling edge).

The counter 232 may include an additional latch circuit and first to N-th latch circuits.

The additional latch circuit may output, as the additional binary signal ABS, a value of the system clock signal SCLK, which corresponds to a point in time when the comparison signal CS has the rising edge (or falling edge). The additional binary signal ABS may be also referred to as a "0-th binary signal BS0".

For example, under the condition that the comparison signal CS has the low-to-high transition, when the system clock signal SCLK is at the high level, the additional latch circuit may generate the additional binary signal ABS having a digital value of "1". In contrast, under the condition that the comparison signal CS has the low-to-high transition, when the system clock signal SCLK is at the low level, the additional latch circuit may generate the additional binary signal ABS having a digital value of "0".

The additional binary signal ABS may correspond to one of bits included in the digital signal DS.

The additional binary signal ABS may correspond to the LSB of the digital signal DS.

In some implementations, when the comparison signal CS has the rising edge (or the low-to-high transition), the first to N-th latch circuits may respectively output digital values of the first to N-th clock signals CK1 to CKN as the first to N-th latch signals.

For example, when the comparison signal CS transitions from the low level to the high level, the first latch circuit may output the digital value of the first clock signal CK1 as the first latch signal LS1. In detail, under the condition that the comparison signal CS has the rising edge, when the first clock signal CK1 is at the high level, the first latch circuit may generate the first latch signal LS1 having a digital value of "1". In contrast, under the condition that the comparison signal CS has the rising edge, when the first clock signal CK1 is at the low level, the first latch circuit may generate the first latch signal LS1 having a digital value of "0".

As in above description, when the comparison signal CS transitions from the low level to the high level, the second latch circuit may output the digital value of the second clock signal CK2 as the second latch signal LS2. In detail, under the condition that the comparison signal CS has the rising edge, when the second clock signal CK2 is at the high level, the second latch circuit may generate the second latch signal LS2 having a digital value of "1". In contrast, under the condition that the comparison signal CS has the rising edge, when the second clock signal CK2 is at the low level, the second latch circuit may generate the second latch signal LS2 having a digital value of "0".

As in the above description, the third to N-th latch circuits may respectively generate the third to N-th latch signals LS3 to LSN.

The first to N-th latch circuits may provide the first to N-th latch signals LS1 to LSN to the converter circuit 233.

The converter circuit 233 may receive the first to N-th latch signals LS1 to LSN. The converter circuit 233 may generate first to N-th binary signals BS1 to BSN based on the first to N-th latch signals LS1 to LSN.

The converter circuit 233 may convert the N-bit gray code including the first to N-th latch signals LS1 to LSN into the N-bit binary code and may generate the first to N-th binary signals BS1 to BSN corresponding to the N-bit binary code.

For example, the first to N-th latch signals LS1 to LSN may respectively indicate the first to N-th bits of the N-bit gray code. The first to N-th binary signals BS1 to BSN may respectively indicate the first to N-th bits of the N-bit binary code.

The first to N-th binary signals BS1 to BSN may respectively correspond to the first to N-th bits of the (N+1)-bit digital signal DS.

The ADC 230 may provide the image signal processor 14 with the additional binary signal ABS and the first to N-th binary signals BS1 to BSN.

The additional binary signal ABS and the first to N-th binary signals BS1 to BSN may have logical sequentiality within the digital signal DS.

For example, the digital signal DS includes (N+1) bits; in this case, the additional binary signal ABS may correspond to the first bit value (the least significant bit) of the digital signal DS, and the first to N-th binary signals BS1 to BSN may respectively correspond to the second to (N+1)-th bit values of the digital signal DS. According to the above description, the additional binary signal ABS may be also referred to as a "0-th binary signal BS0".

Figure 10:
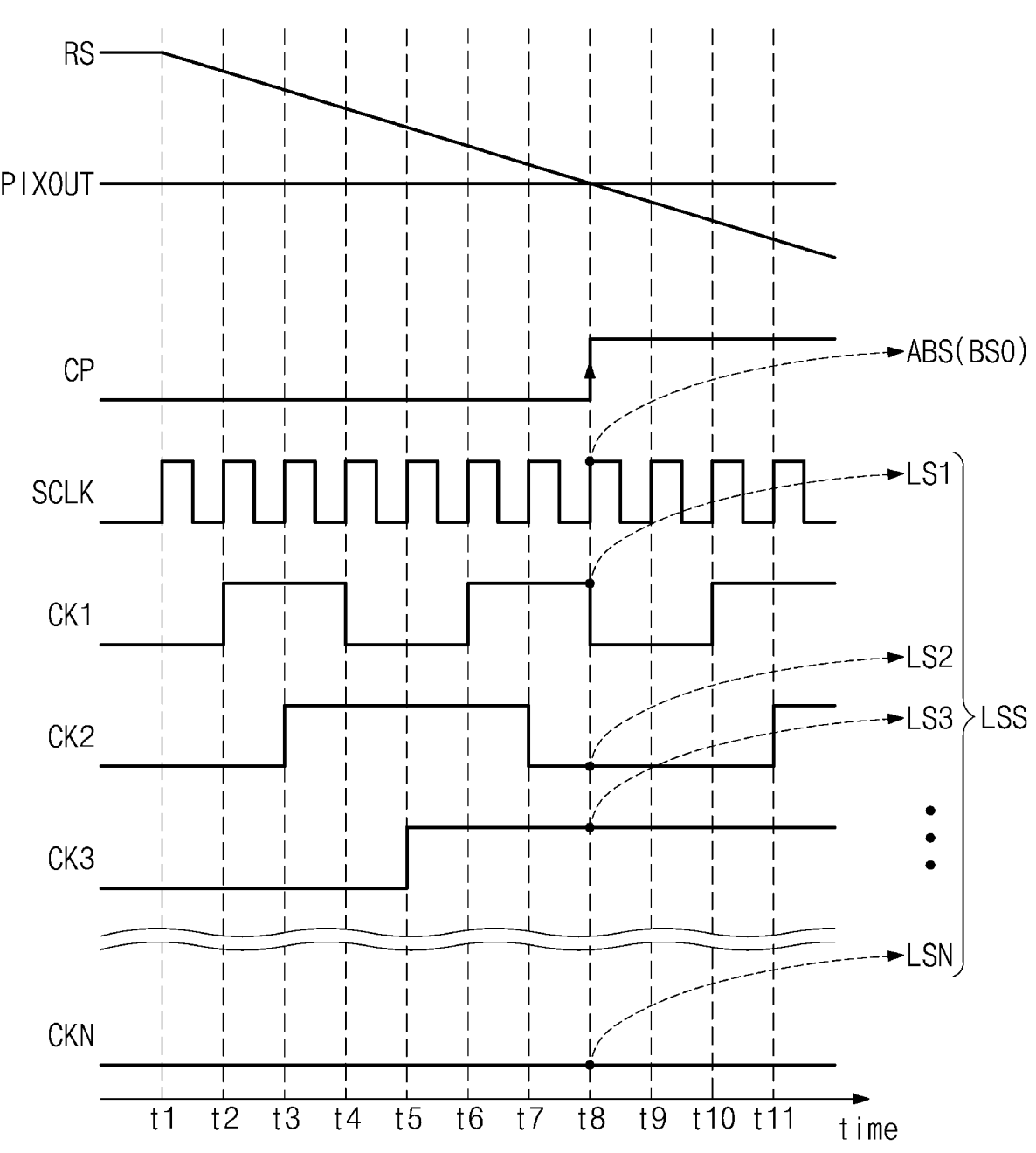
FIG. 10 is a timing diagram describing an example operation of an ADC circuit of FIG. 8.

FIG. 10 is a block diagram for describing an operation of an ADC circuit of FIG. 8. An operation of the ADC circuit 200 of FIG. 8 will be described with reference to FIG. 10. Signals illustrated in FIG. 10 correspond to signals with the same reference signs illustrated in FIGS. 8 and 9. For brevity, the description that is the same as the description given with reference to FIGS. 8 and 9 will be omitted to avoid redundancy.

The ramp signal RS may decrease from the start level along a given slope. The start level may be greater than the voltage level of the pixel signal PIXOUT. At the eighth point in time t8, the voltage level of the ramp signal RS may be identical to the voltage level of the pixel signal PIXOUT.

From the first point in time t1 to the eighth point in time t8, because the voltage level of the ramp signal RS is greater than the voltage level of the pixel signal PIXOUT, the comparison signal CS is at the low level. From the eighth point in time t8 to the eleventh point in time t11, because the voltage level of the ramp signal RS is smaller than or equal to than the voltage level of the pixel signal PIXOUT, the comparison signal CS is at the high level.

The system clock signal SCLK has the low-to-high transition (i.e., the rising edge) at each of the first to eleventh points in time t1 to t11.

The first to N-th clock signals CK1 to CKN may respectively correspond to the first to N-th bits of the N-bit gray code. The N-bit gray code may include N bits. The N-bit gray code may correspond to a decimal number. A value of the decimal number may be "0" at the first point in time t1 and may increase by one every rising edge of the system clock signal SCLK.

For example, from the first point in time t1 to before the second point in time t2, the N-bit gray code may correspond to the decimal number of "0". In other words, the N-bit gray code is [0, . . . 0, 0, 0]; in this case, each of the first to N-th clock signals CK1 to CKN is at the low level.

From the second point in time t2 to before the third point in time t3, the N-bit gray code may correspond to the decimal number of "1". In other words, the N-bit gray code is [0, . . . 0, 0, 1]; in this case, the first clock signal CK1 is at the high level, and the remaining clock signals CK2 to CKN are at the low level.

From the third point in time t3 to before the fourth point in time t4, the N-bit gray code may correspond to the decimal number of "2". In other words, the N-bit gray code is [0, . . . 0, 1, 1]; in this case, the first clock signal CK1 is at the high level, the second clock signal CK2 is at the high level, and the remaining clock signals CK3 to CKN are at the low level.

From the fourth point in time t4 to before the fifth point in time t5, the N-bit gray code may correspond to the decimal number of "3". In other words, the N-bit gray code is [0, . . . 0, 1, 0]; in this case, the first clock signal CK1 is at the low level, the second clock signal CK2 is at the high level, and the remaining clock signals CK3 to CKN are at the low level.

From the fifth point in time t5 to before the sixth point in time t6, the N-bit gray code may correspond to the decimal number of "4". In other words, the N-bit gray code is [0, . . . 1, 1, 0]; in this case, the first clock signal CK1 is at the low level, the second clock signal CK2 is at the high level, the third clock signal CK3 is at the high level, and the remaining clock signals CK4 to CKN are at the low level.

From the sixth point in time t6 to before the seventh point in time t7, the N-bit gray code may correspond to the decimal number of "5". In other words, the N-bit gray code is [0, . . . 1, 1, 1]; in this case, the first clock signal CK1 is at the high level, the second clock signal CK2 is at the high level, the third clock signal CK3 is at the high level, and the remaining clock signals CK4 to CKN are at the low level.

From the seventh point in time t7 to before the eighth point in time t8, the N-bit gray code may correspond to the decimal number of "6". In other words, the N-bit gray code is [0, . . . 1, 0, 1]; in this case, the first clock signal CK1 is at the high level, the second clock signal CK2 is at the low level, the third clock signal CK3 is at the high level, and the remaining clock signals CK4 to CKN are at the low level.

From the eighth point in time t8 to before the ninth point in time t9, the N-bit binary code may correspond to the decimal number of "7". In other words, the N-bit binary code is [0, . . . 1, 0, 0]; in this case, the first clock signal CK1 is at the low level, the second clock signal CK2 is at the low level, the third clock signal CK3 is at the high level, and the remaining clock signals CK4 to CKN are at the low level.

As in the above description, after the ninth point in time t9, the first to N-th clock signals CK1 to CKN may respectively correspond to the bits of the N-bit gray code.

At the eighth point in time t8, because the system clock signal SCLK is at the high level (or transitions from the low level to the high level), an additional latch circuit (e.g., the additional latch circuit of FIG. 9) may output a digital value of "1" as the additional binary signal ABS.

First to N-th latch circuits (e.g., the first to N-th latch circuits of FIG. 9) may respectively output, as the first to N-th latch signals LS1 to LSN, digital values of the first to N-th clock signals CK1 to CKN, which correspond to the eighth point in time t8.

For example, at the eighth point in time t8, because the first clock signal CK1 is at the high level, the first latch circuit may output a digital value of "1" as the first latch signal LS1. At the eighth point in time t8, because the second clock signal CK2 is at the low level, the second latch circuit may output a digital value of "0" as the second latch signal LS2. At the eighth point in time t8, because the third clock signal CK3 is at the high level, the third latch circuit may output a digital value of "1" as the third latch signal LS3. At the eighth point in time t8, because the N-th clock signal CKN is at the low level, the N-th latch circuit may output a digital value of "0" as the N-th latch signal LSN. Although not illustrated in FIG. 10, as in the above description, the fourth to (N−1)-th latch circuits may respectively output the fourth to (N−1)-th latch signals LS4 to LSN-1.

A counter (e.g., the counter 232 of FIG. 9) may provide the converter circuit 233 with a latch signal set LSS including the first to N-th latch signals LS1 to LSN.

For convenience, the description is given with reference to FIG. 10 as the ramp signal RS decreases over time, the comparison signal CS includes the rising edge, and the first to N-th clock signals CK1 to CKN change in response to the rising edge of the system clock signal SCLK. However, the present disclosure is not limited thereto. For example, the ramp signal RS may increase over time; in this case, the comparison signal CS may include the falling edge, and the first to N-th clock signals CK1 to CKN may change in response to the falling edge of the system clock signal SCLK.

Figure 11:
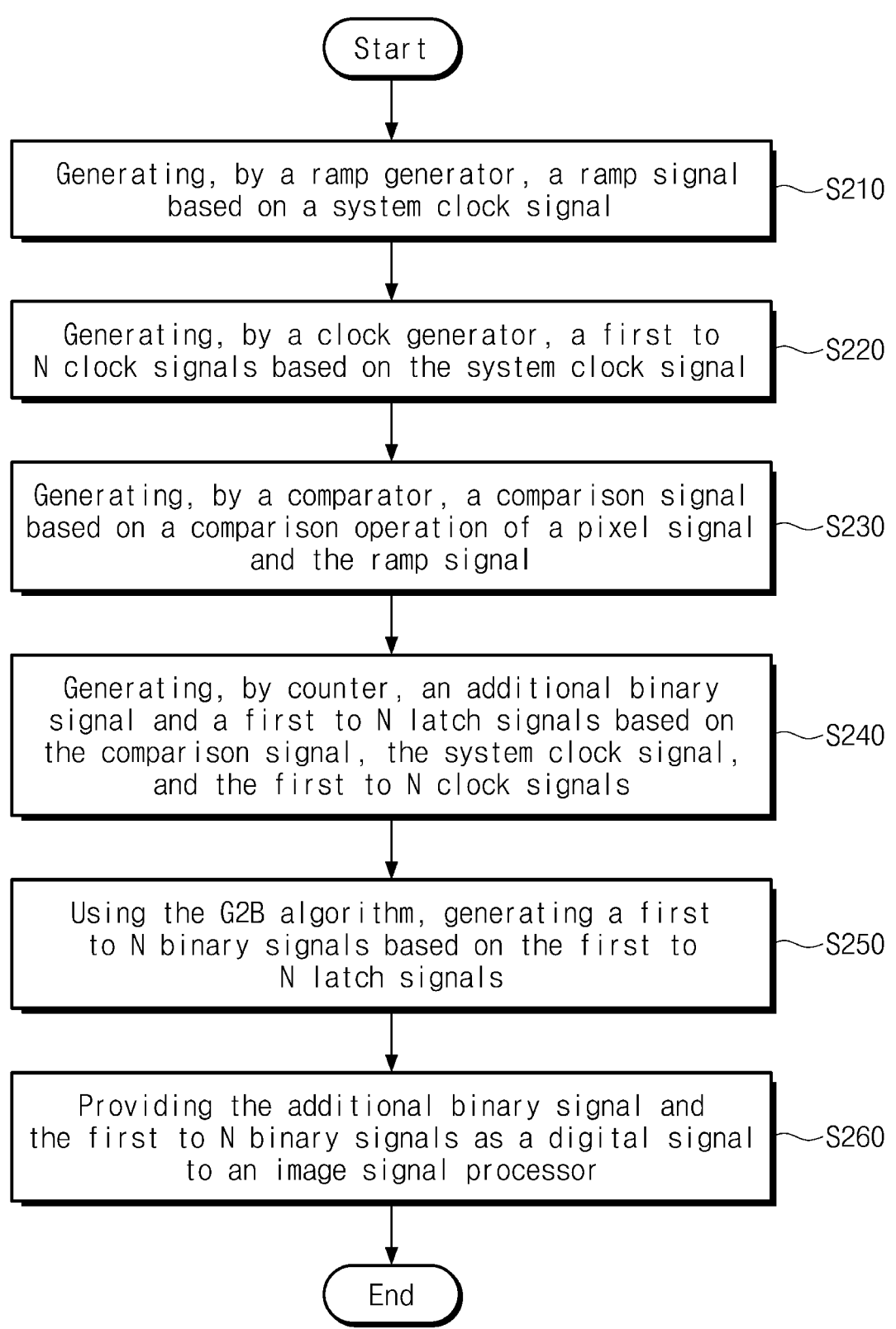
FIG. 11 is a flowchart illustrating an example operation of an ADC circuit of FIG. 8.

FIG. 11 is a flowchart illustrating an operation of an ADC circuit of FIG. 8. An operation method of the ADC circuit 200 will be described with reference to FIG. 11. A ramp generator, a clock generator, a comparator, and a counter of FIG. 11 respectively correspond to the ramp generator 210, the clock generator 220, the comparator 231, and the counter 232 of FIG. 9.

In operation S210, the ramp generator of the ADC circuit may generate a ramp signal based on a system clock signal.

In operation S220, the clock generator of the ADC circuit may generate first to N-th clock signals based on the system clock signal.

In operation S230, the comparator of the ADC circuit may generate a comparison signal based on a result of comparing a pixel signal with the ramp signal.

In some embodiments, operation S230 may include generating the comparison signal having a low level when the voltage level of the ramp signal is greater than the voltage level of the pixel signal and generating the comparison signal having a high level when the voltage level of the ramp signal is not greater than the voltage level of the pixel signal.

In operation S240, the counter of the ADC circuit may generate an additional binary signal and first to N-th latch signals based on the comparison signal, the system clock signal, and the first to N-th clock signals.

In an implementation, the counter may include an additional latch circuit and first to N-th latch circuits. The additional latch circuit may be configured to generate an additional binary signal based on the system clock signal and the comparison signal. The first to N-th latch circuits may be configured to respectively generate the first to N-th latch signals based on the comparison signal and the first to N-th clock signals.

In operation S250, the counter of the ADC may generate first to N-th binary signals based on the first to N-th latch signals.

The first to N-th latch signals may respectively indicate first to N-th bits of an N-bit gray code.

The first to N-th binary signals may respectively indicate first to N-th bits of an N-bit binary code.

In operation S260, the ADC may provide an image signal processor with the additional binary signal and the first to N-th binary signals as a digital signal.

The additional binary signal may correspond to one of bits of the digital signal.

The additional binary signal may correspond to the LSB of the digital signal.

The additional binary signal may correspond to the LSB of the (N+1)-bit digital signal, and the first to N-th binary signals may respectively correspond to the second to (N+1)-th bits of the (N+1)-bit digital signal.

Figure 12:
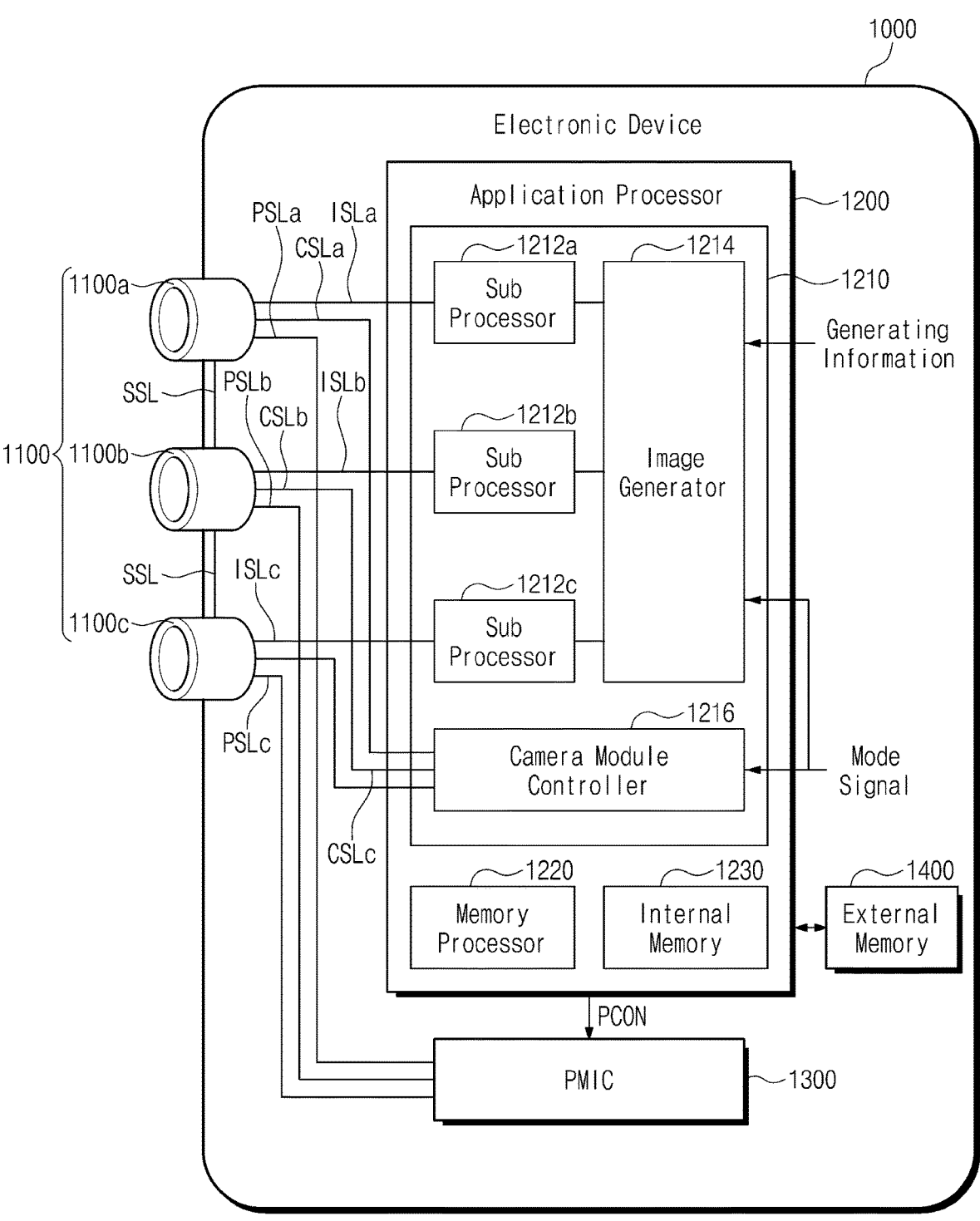
FIG. 12 is a block diagram of an example electronic device including a multi-camera module.
Figure 13:
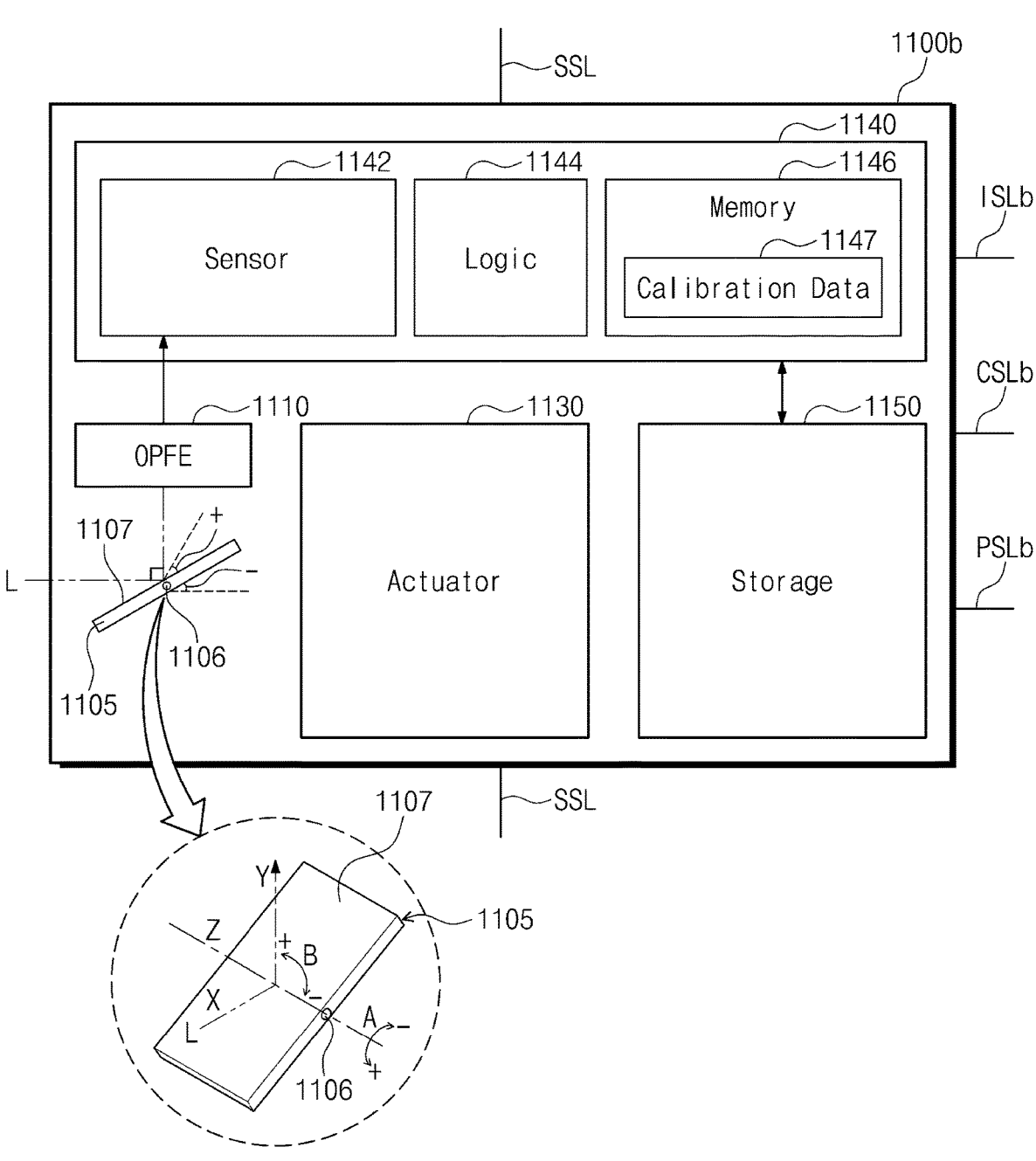
FIG. 13 is a block diagram illustrating an example of the camera module of FIG. 12.

FIG. 12 is a block diagram of an electronic device including a multi-camera module. FIG. 13 is a block diagram illustrating a camera module of FIG. 12 in detail.

Referring to FIG. 12, an electronic device 1000 may include a camera module group 1100, an application processor 1200, a Power Management Integrated Circuit (PMIC) 1300, and an external memory 1400.

The camera module group 1100 may include a plurality of camera modules 1100a, 1100b, and 1100c. An electronic device including three camera modules 1100a, 1100b, and 1100*c* is illustrated in FIG. 12, but the present disclosure is not limited thereto. The camera module group 1100 may be modified to include only two camera modules. Also, the camera module group 1100 may be modified to include "n" camera modules (n being a natural number of 4 or more).

Below, a detailed configuration of the camera module 1100*b* will be more fully described with reference to FIG. 13, but the following description may be equally applied to the remaining camera modules 1100*a* and 1100*c*.

Referring to FIG. 13, the camera module 1100*b* may include a prism 1105, an optical path folding element (OPFE) 1110, an actuator 1130, an image sensing device 1140, and storage 1150.

The prism 1105 may include a reflecting plane 1107 of a light reflecting material and may change a path of a light "L" incident from the outside.

The prism 1105 may change a path of the light "L" incident in a first direction (X) to a second direction (Y) perpendicular to the first direction (X). Also, the prism 1105 may change the path of the light "L" incident in the first direction (X) to the second direction (Y) perpendicular to the first (X-axis) direction by rotating the reflecting plane 1107 of the light reflecting material in direction "A" about a central axis 1106 or rotating the central axis 1106 in direction "B". In this case, the OPFE 1110 may move in a third direction (Z) perpendicular to the first direction (X) and the second direction (Y).

In some implementations, as illustrated in FIG. 13, a maximum rotation angle of the prism 1105 in direction "A" may be equal to or smaller than 15 degrees in a positive A direction and may be greater than 15 degrees in a negative A direction, but the present disclosure is not limited thereto.

The prism 1105 may move within approximately 20 degrees in a positive or negative B direction, between 10 degrees and 20 degrees, or between 15 degrees and 20 degrees; here, the prism 1105 may move at the same angle in the positive or negative B direction or may move at a similar angle within approximately 1 degree.

The prism 1105 may move the reflecting plane 1107 of the light reflecting material in the third direction (e.g., Z direction) parallel to a direction in which the central axis 1106 extends.

The OPFE 1110 may include optical lenses composed of "m" groups (m being a natural number), for example. Here, "m" lens may move in the second direction (Y) to change an optical zoom ratio of the camera module 1100*b*. For example, when a default optical zoom ratio of the camera module 1100*b* is "Z", the optical zoom ratio of the camera module 1100*b* may be changed to an optical zoom ratio of 3Z, 5Z, or 5Z or more by moving "m" optical lens included in the OPFE 1110.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. The image sensor 1142 corresponds the image sensor 10 of FIG. 1. The image sensor 1142 may include the ADC circuit according to the present disclosure. The control logic 1144 may control overall operations of the camera module 1100*b*. For example, the control logic 1144 may control an operation of the camera module 1100*b* based on a control signal provided through a control signal line CSLb.

The memory 1146 may store information, which is necessary for an operation of the camera module 1100*b*, such as calibration data 1147. The calibration data 1147 may include information necessary for the camera module 1100*b* to generate image data by using the light "L" provided from the outside. The calibration data 1147 may include, for example, information about the degree of rotation described above, information about a focal length, information about an optical axis, etc. In the case where the camera module 1100*b* is implemented in the form of a multi-state camera in which a focal length varies depending on a location of an optical lens, the calibration data 1147 may include a focal length value for each location (or state) of the optical lens and information about auto focusing.

The storage 1150 may store image data sensed through the image sensor 1142. The storage 1150 may be disposed outside the image sensing device 1140 and may be implemented in a shape where the storage 1150 and a sensor chip constituting the image sensing device 1140 are stacked. The storage 1150 may be implemented with an electrically erasable programmable read only memory (EEPROM), but the present disclosure is not limited thereto.

Referring together to FIGS. 12 and 13, in some implementations, each of the plurality of camera modules 1100*a*, 1100*b*, and 1100*c* may include the actuator 1130. As such, the same calibration data 1147 or different calibration data 1147 may be included in the plurality of camera modules 1100*a*, 1100*b*, and 1100*c* depending on operations of the actuators 1130 therein.

In some implementations, one camera module (e.g., 1100*b*) among the plurality of camera modules 1100*a*, 1100*b*, and 1100*c* may be a folded lens shape of a camera module in which the prism 1105 and the OPFE 1110 described above are included, and the remaining camera modules (e.g., 1100*a* and 1100*c*) may be a vertical shape of a camera module in which the prism 1105 and the OPFE 1110 described above are not included; however, the present disclosure is not limited thereto.

In some implementations, one camera module (e.g., 1100*c*) among the plurality of camera modules 1100*a*, 1100*b*, and 1100*c* may be, for example, a vertical shape of depth camera extracting depth information by using an infrared ray (IR). In this case, the application processor 1200 may merge image data provided from the depth camera and image data provided from any other camera module (e.g., 1100*a* or 1100*b*) and may generate a three-dimensional (3D) depth image.

In some implementations, at least two camera modules (e.g., 1100*a* and 1100*b*) among the plurality of camera modules 1100*a*, 1100*b*, and 1100*c* may have different fields of view. In this case, the at least two camera modules (e.g., 1100*a* and 1100*b*) among the plurality of camera modules 1100*a*, 1100*b*, and 1100*c* may include different optical lenses, but the present disclosure is not limited thereto.

Also, in some implementations, fields of view of the plurality of camera modules 1100*a*, 1100*b*, and 1100*c* may be different. In this case, the plurality of camera modules 1100*a*, 1100*b*, and 1100*c* may include different optical lenses, not limited thereto.

The plurality of camera modules 1100*a*, 1100*b*, and 1100*c* may be disposed to be physically separated from each other. That is, the plurality of camera modules 1100*a*, 1100*b*, and 1100*c* may not use a sensing area of one image sensor 1142, but the plurality of camera modules 1100a, 1100b, and 1100c may include independent image sensors 1142 therein, respectively.

Returning to FIG. 12, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c, the number of which corresponds to the number of the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface), but the present disclosure is not limited thereto.

Meanwhile, in some implementations, one sub image processor may be disposed to correspond to a plurality of camera modules. For example, the sub image processor 1212a and the sub image processor 1212c may be integrally implemented, not separated from each other as illustrated in FIG. 12; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information, Generating Information, or a mode signal.

In detail, the image generator 1214 may generate the output image by merging at least a portion of the image data respectively generated from the camera modules 1100a, 1100b, and 1100c having different fields of view, depending on the image generating information, Generating Information, or the mode signal. Also, the image generator 1214 may generate the output image by selecting one of the image data respectively generated from the camera modules 1100a, 1100b, and 1100c having different fields of view, depending on the image generating information, Generating Information, or the mode signal.

The image generating information, Generating Information, may include a zoom signal or a zoom factor. Also, the mode signal may be, for example, a signal based on a mode selected from a user.

In the case where the image generating information, Generating Information, is the zoom signal (or zoom factor) and the camera modules 1100a, 1100b, and 1100c have different visual fields of view, the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c and may output the selected image data as the output image. However, the present disclosure is not limited thereto, and a way to process image data may be modified without limitation if necessary.

The image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

One of the plurality of camera modules 1100a, 1100b, and 1100c may be designated as a master camera (e.g., 1100b) depending on the image generating information, Generating Information, including a zoom signal or the mode signal, and the remaining camera modules (e.g., 1100a and 1100c) may be designated as slave cameras. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

The control signal provided from the camera module controller 1216 to each of the camera modules 1100a, 1100b, and 1100c may include a sync enable signal. For example, in the case where the camera module 1100b is used as a master camera and the camera modules 1100a and 1100c are used as slave cameras, the camera module controller 1216 may transmit the sync enable signal to the camera module 1100b. The camera module 1100b that is provided with sync enable signal may generate a sync signal based on the provided sync enable signal and may provide the generated sync signal to the camera modules 1100a and 1100c through a sync signal line SSL. The camera module 1100*b* and the camera modules 1100*a* and 1100*c* may be synchronized with the sync signal to transmit image data to the application processor 1200.

The control signal provided from the camera module controller 1216 to each of the camera modules 1100*a*, 1100*b*, and 1100*c* may include mode information according to the mode signal. Based on the mode information, the plurality of camera modules 1100*a*, 1100*b*, and 1100*c* may operate in a first operating mode and a second operating mode with regard to a sensing speed.

In the first operating mode, the plurality of camera modules 1100*a*, 1100*b*, and 1100*c* may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212*a*, 1212*b*, and 1212*c* of the image processing device 1210 may perform decoding and may also perform image processing on the decoded image signal.

In the second operating mode, the plurality of camera modules 1100*a*, 1100*b*, and 1100*c* may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply power, for example, power supply voltages to the plurality of camera modules 1100*a*, 1100*b*, and 1100*c*, respectively. For example, under control of the application processor 1200, the PMIC 1300 may supply a first power to the camera module 1100*a* through a power signal line PSLa, may supply a second power to the camera module 1100*b* through a power signal line PSLb, and may supply a third power to the camera module 1100*c* through a power signal line PSLc.

In response to a power control signal PCON from the application processor 1200, the PMIC 1300 may generate a power corresponding to each of the plurality of camera modules 1100*a*, 1100*b*, and 1100*c* and may adjust a level of the power. The power control signal PCON may include a power adjustment signal for each operating mode of the plurality of camera modules 1100*a*, 1100*b*, and 1100*c*. For example, the operating mode may include a low-power mode. In this case, the power control signal PCON may include information about a camera module operating in the low-power mode and a set power level. Levels of the powers respectively provided to the plurality of camera modules 1100*a*, 1100*b*, and 1100*c* may be identical to each other or may be different from each other. Also, a level of a power may be dynamically changed.

According to an implementation of the present disclosure, an ADC circuit including an additional latch circuit, an image sensor including the same, and an operation method of the image sensor are provided.

Also, an ADC circuit, which is capable of improving a resolution, reducing the area of a circuit chip, and reducing power consumption and the time required by using a system clock signal in processing a least significant bit (LSB) of a digital signal such that the number of bits of the digital signal increases without additional clock conversion, an image sensor including the same, and an operation method of the image sensor are provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. An analog-to-digital converter (ADC) circuit comprising:
   a ramp generator configured to generate a ramp signal based on a system clock signal;
   a clock generator configured to generate first to N-th clock signals based on the system clock signal;
   a comparator configured to generate a comparison signal based on a result of comparing a pixel signal received from a pixel array and the ramp signal; and
   a counter including first to N-th latch circuits and an additional latch circuit,
   wherein the first to N-th latch circuits are configured to respectively generate first to N-th latch signals based on the comparison signal and corresponding clock signal among the first to N-th clock signals,
   wherein the additional latch circuit is configured to generate an additional binary signal based on the system clock signal and the comparison signal,
   wherein "N" is a positive integer.

2. The ADC circuit of claim 1, wherein the counter is configured to provide the additional binary signal and the first to N-th latch signals as a digital signal to an image signal processor.

3. The ADC circuit of claim 2, wherein the additional binary signal corresponds with a least significant bit of the digital signal and the first to N-th latch signals correspond with, in order, 2nd to (N+1)-th least significant bits of the digital signal.

4. The ADC circuit of claim 1, wherein the comparator is configured to:
   generate the comparison signal having a low level when a voltage level of the ramp signal is higher than a voltage level of the pixel signal; and
   generate the comparison signal having a high level when the voltage level of the ramp signal is not higher than the voltage level of the pixel signal.

5. The ADC circuit of claim 4, wherein the additional latch circuit is configured to:

generate the additional binary signal having a digital value of the system clock signal when the voltage level of the ramp signal is identical to the voltage level of the pixel signal, and wherein the first to N-th latch circuits are configured to:

generate the first to N-th latch signals, respectively, having digital values of the corresponding clock signal among the first to Nth clock signals when the voltage level of the ramp signal is identical to the voltage level of the pixel signal.

6. The ADC circuit of claim 1, wherein the clock generator is configured to generate the first to Nth clock signals based on the system clock signal, by using a binary code algorithm.

7. The ADC circuit of claim 1, wherein the clock generator is configured to generate the first to Nth clock signals based on the system clock signal, by using a gray code algorithm, wherein the ADC circuit comprises:

a converter circuit configured to generate first to N-th binary signals based on the first to N-th latch signals from the counter, by using a gray-to-binary (G2B) algorithm, and wherein the additional binary signal and the first to N-th binary signals are provided to an image signal processor as a digital signal.

8. The ADC circuit of claim 7, wherein the additional binary signal corresponds with a least significant bit of the digital signal and the first to N-th binary signals correspond to, in order, 2nd to (N+1)-th least significant bits of the digital signal.

9. An image sensor comprising:

a pixel array including a plurality of pixel columns respectively generating a plurality of pixel signals; and an analog-to-digital converter (ADC) circuit including a ramp generator configured to generate a ramp signal based on a system clock signal, a clock generator configured to generate first to Nth clock signals based on the system clock signal, and a plurality of ADCs, wherein a first ADC among the plurality of ADCs includes:

a first comparator configured to generate a first comparison signal based on a result of comparing a first pixel signal from a first pixel column among the plurality of pixel columns and the ramp signal from the ramp generator;

a first additional latch circuit configured to generate a first additional binary signal based on the system clock signal and the first comparison signal; and first to N-th latch circuits configured to generate first to N-th latch signals based on the first comparison signal and corresponding clock signal among the first to Nth clock signals, wherein "N" is a positive integer.

10. The image sensor of claim 9, wherein a second ADC among the plurality of ADCs includes:

a second comparator configured to generate a second comparison signal based on a result of comparing a second pixel signal from a second pixel column among the plurality of pixel columns and the ramp signal from the ramp generator;

a second additional latch circuit configured to generate a second additional binary signal based on the system clock signal and the second comparison signal; and (N+1)-th to 2N-th latch circuits configured to respectively generate (N+1)-th to 2N-th latch signals based on the second comparison signal and corresponding clock signal among the first to Nth clock signals.

11. The image sensor of claim 10, wherein the clock generator is further configured to:

generate the first to Nth clock signals based on the system clock signal, by using a binary code algorithm, wherein the first ADC is configured to:

provide an image signal processor with the first additional binary signal and the first to N-th latch signals as a first digital signal, and wherein the second ADC is configured to:

provide the image signal processor with the second additional binary signal and the (N+1)-th to 2N-th latch signals as a second digital signal.

12. The image sensor of claim 11, wherein the first additional binary signal corresponds to a least significant bit of the first digital signal and the first to N-th latch signals correspond, in order, with 2nd to (N+1)-th least significant bits of the first digital signal, and wherein the second additional binary signal corresponds with a least significant bit of the second digital signal and the (N+1)-th to 2N-th latch signals correspond, in order, with 2nd to (N+1)-th least significant bits of the second digital signal.

13. The image sensor of claim 10, wherein the clock generator is further configured to:

generate the first to Nth clock signals based on the system clock signal, by using a gray code algorithm, wherein the first ADC further includes:

a first converter circuit configured to generate first to N-th binary signals based on the first to N-th latch signals from a counter, by using a gray-to-binary (G2B) algorithm, and wherein the second ADC further includes:

a second converter circuit configured to generate (N+1)-th to 2N-th binary signals based on the (N+1)-th to 2N-th latch signals by using the G2B algorithm.

14. The image sensor of claim 13, wherein the first ADC is configured to:

provide an image signal processor with the first additional binary signal and the first to N-th binary signals as a first digital signal, and wherein the second ADC is configured to:

provide the image signal processor with the second additional binary signal and the (N+1)-th to 2N-th binary signals as a second digital signal.

15. The image sensor of claim 14, wherein the first additional binary signal corresponds with a least significant bit of the first digital signal and the first to N-th binary signals correspond, in order, with 2nd to (N+1)-th least significant bits of the first digital signal, and wherein the second additional binary signal corresponds with a least significant bit of the second digital signal and the (N+1)-th to 2N-th binary signals correspond with 2nd to (N+1)-th least significant bits of the second digital signal.

16. The image sensor of claim 10, wherein the first comparator is configured to:

generate the first comparison signal having a low level when a voltage level of the ramp signal is higher than a voltage level of the first pixel signal; and generate the first comparison signal having a high level when the voltage level of the ramp signal is not higher than the voltage level of the first pixel signal, and wherein the second comparator is configured to:

generate the second comparison signal having the low level when the voltage level of the ramp signal is higher than a voltage level of the second pixel signal; and generate the second comparison signal having the high level when the voltage level of the ramp signal is not higher than the voltage level of the second pixel signal.

17. The image sensor of claim 10, wherein the first additional latch circuit is configured to:

generate the first additional binary signal having a digital value of the system clock signal when a voltage level of the ramp signal is identical to a voltage level of the first pixel signal, and wherein the second additional latch circuit is configured to:

generate the second additional binary signal having a digital value of the system clock signal when the voltage level of the ramp signal is identical to a voltage level of the second pixel signal.

18. An operation method of an analog-to-digital converter (ADC) circuit which includes a ramp generator, a clock generator, a comparator, and a counter, the method comprising:

generating, by the ramp generator, a ramp signal based on a system clock signal;

generating, by the clock generator, first to Nth clock signals based on the system clock signal;

generating, by the comparator, a comparison signal based on a result of comparing a pixel signal received from a pixel array and the ramp signal; and generating, by the counter, an additional binary signal and first to N-th latch signals based on the comparison signal, the system clock signal, and the first to Nth clock signals, wherein the counter includes:

an additional latch circuit configured to generate the additional binary signal based on the system clock signal and the comparison signal; and first to N-th latch circuits configured to generate, respectively, the first to N-th latch signals based on the comparison signal and corresponding clock signal among the first to Nth clock, and wherein "N" is a positive integer.

19. The method of claim 18, further comprising providing an image signal processor with the additional binary signal and the first to N-th latch signals as a digital signal.

20. The method of claim 18, wherein the ADC circuit further comprises a converter circuit, and the method further comprising:

generating, by the converter circuit, first to N-th binary signals based on the first to N-th latch signals, by using a gray code algorithm; and providing an image signal processor with the additional binary signal and the first to N-th binary signals as a digital signal.

\* \* \* \* \*